US011879170B2

(12) United States Patent
Yao et al.

(10) Patent No.: US 11,879,170 B2
(45) Date of Patent: Jan. 23, 2024

(54) STRESS PATTERNING SYSTEMS AND METHODS FOR MANUFACTURING FREE-FORM DEFORMATIONS IN THIN SUBSTRATES

(71) Applicant: Massachusetts Institute of Technology, Cambridge, MA (US)

(72) Inventors: Youwei Yao, Waltham, MA (US); Brandon Chalifoux, Willimantic, CT (US); Mark Schattenburg, Framingham, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 652 days.

(21) Appl. No.: 16/993,733

(22) Filed: Aug. 14, 2020

(65) Prior Publication Data
US 2021/0047729 A1    Feb. 18, 2021

Related U.S. Application Data

(60) Provisional application No. 62/886,499, filed on Aug. 14, 2019.

(51) Int. Cl.
*C23C 16/44* (2006.01)
*C23C 18/16* (2006.01)
(Continued)

(52) U.S. Cl.
CPC ...... *C23C 16/4407* (2013.01); *C23C 18/1607* (2013.01); *G21K 1/067* (2013.01);
(Continued)

(58) Field of Classification Search
CPC ............. G21K 1/067; G21K 2201/064; G21K 2201/067
See application file for complete search history.

(56) References Cited

U.S. PATENT DOCUMENTS 6,600,565 B1    7/2003  Suresh et al.
7,363,173 B2    4/2008  Rosakis et al.
(Continued)

OTHER PUBLICATIONS

[NPL-1] Y.-L. Shen, S. Suresh, and I. A. Blech, "Stresses, curvatures, and shape changes arising from patterned lines on silicon wafers." J. Appl. Phys., vol. 80, No. 3, Aug. 1, 1996, pp. 1388-1398. (Year: 1996).*

(Continued)

*Primary Examiner* — David Sample
*Assistant Examiner* — Donald M Flores, Jr.
(74) *Attorney, Agent, or Firm* — DALY, CROWLEY, MOFFORD & DURKEE, LLP

(57) ABSTRACT

A device includes a substrate and a stressed layer disposed on a first surface of the substrate. The stressed layer includes: a first set of patterns having a predetermined geometry, size, and arrangement selected to control an equibiaxial stress field of the stressed layer, wherein the equibiaxial stress field varies in magnitude over the first surface of the substrate, and a second set of patterns etched into the first set of patterns and the substrate, the second set of patterns comprising a plurality of substantially parallel lines arranged to control at least a uniaxial stress field of the stressed layer, wherein the uniaxial stress field varies in magnitude over the first surface of the substrate.

16 Claims, 25 Drawing Sheets

(51) Int. Cl.
H01L 21/02 (2006.01)
G21K 1/06 (2006.01)

(52) U.S. Cl.
CPC .. H01L 21/02123 (2013.01); *G21K 2201/064* (2013.01); *G21K 2201/067* (2013.01); *H01L 21/02002* (2013.01)

(56) References Cited

U.S. PATENT DOCUMENTS

| | | | |
|---|---|---|---|
| 8,299,615 | B2 | 10/2012 | Fayaz et al. |
| 8,710,629 | B2 | 4/2014 | Bai et al. |
| 9,355,967 | B2 | 5/2016 | Kim et al. |
| 9,659,131 | B2 | 5/2017 | Blackshear et al. |
| 10,083,917 | B1 | 9/2018 | Joshi et al. |
| 2018/0342410 | A1 | 11/2018 | Hooge et al. |

OTHER PUBLICATIONS

Alaluf, et al., "Unimorph mirror for adaptive optics in space telescopes;" Applied Optics, vol. 57, No. 14; May 2, 2018; 10 pages.

Amano, et al., "The 2018 GaN power electronics roadmap;" Journal of Physic D: Applied Physics, vol. 51, Mar. 26, 2018; 49 pages.

Bernard, "Advantages of Using Gallium Nitride FETs in Satellite Applications;" White Paper—Gallium Nitride FETs in Satellite Applications; Feb. 2018; 7 pages.

Bishop, et al., "Thickness distribution of sputtered films on curved substrates for adjustable x-ray optics;" Journal of Astronomical Telescopes, Instruments, and Systems; Mar. 23, 2019; 15 pages.

Chalifoux, et al., "Simulations of film stress effects on mirror segments for the Lynx X-ray Observatory concept;" Journal of Astronomical Telescopes, Instruments, and Systems; Mar. 9, 2019; 11 pages.

Chalifoux, et al., "Using ion implantation for figure correction in glass and silicon mirror substrates for x-ray telescopes;" Proceedings of SPIE; Aug. 29, 2017; 17 pages.

Chalifoux, et al., "Correcting flat mirrors with surface stress: analytical stress fields;" Journal of the Optical Society of America; Sep. 17, 2018; 12 pages.

Cotroneo, et al., "Progress in development of adjustable optics for x-ray astronomy;" Proceedings of SPIE; Oct. 26, 2018; 11 pages.

Gaskin, et al., "Lynx Mission concept status;" Proceedings of SPIE; Sep. 19, 2017; 14 pages.

Ghigo, et al., "Final correction by Ion Beam Figuring of thin shells for X-ray telescopes;" Proceedings of SPIE; Jul. 10, 2018.

Kim, et al., "Wafer level Cu—Cu direct bonding for 3D integration;" Microelectronic Engineering, vol. 137; Dec. 30, 2014; 6 pages.

Lee, et al., Wafer-to-Wafer Alignment for Three-Dimensional Integration: A Review; Journal of Microelectromechanical Systems, vol. 20, No. 4; Aug. 2011; 15 pages.

Marte, et al., "Advances in Memory Die Stacking;" 2018 IEEE 68th Electronic Components and Technology Conference; May 29, 2018; 12 pages.

Matsuyama, et al., "Nearly diffraction-limited X-ray focusing with variable-numerical aperture focusing optical system based on four deformable mirrors;" Scientific Reports; Apr. 21, 2016; 8 pages.

Mauder, et al., "On the anisotropic wafer curvature of GaN-based heterostructures on Si( 1 1 0) substrates grown by MOVPE;" Journal of Crystal Growth, vol. 315; Sep. 16, 2010.

Nguyen, "HOTTech Program Overview" 5th Annual Meeting of the Venus Exploration Analysis Group (VEXAG); Nov. 14, 2017; 16 pages.

O'Dell, et al., "Toward large-area sub-arcsecond x-ray telescopes II;" Proceedings of SPIE; Oct. 27, 2016; 18 pages.

Shen, et al., "Stresses, curvatures, and shape changes arising from patterned lines on silicon wafers;" Journal of Applied Physics, vol. 80; Aug. 17, 1998; 12 pages.

Shi, et al., "A novel solution to improve saddle-shape warpage in 3D NAND flash memory;" Semiconductor Science and Technology, vol. 35; Mar. 19, 2020; 7 pages.

Ulmer, et al., "Magnetostrictively deforming the surface of a silicon wafer at two locations;" Proceedings of SPIE; Sep. 18, 2018; 10 pages.

Vrinceanu, et al., "Measurement of residual stress in single crystal silicon wafers;" 8th International Symposium of Advanced Packaging Materials; Mar. 3, 2002; 5 pages.

Wang, et al., "Control wafer bow of InGaP on 200 mm Si by strain engineering;" Semiconductor Science and Technology, vol. 32; Nov. 8, 2017; 8 pages.

Wikström, et al., "Thermoelastic analysis of periodic thin lines deposited on a substrate;" Journal of the Mechanics and Physics of Solids, vol. 47; Sep. 1, 1998; 18 pages.

Yao, et al., "Progress of coating stress compensation of silicon mirrors for Lynx x-ray telescope mission concept using thermal oxide patterning method;" Journal of Astronomical Telescopes, Instruments, and Systems, vol. 5; Apr. 29, 2019; 10 pages.

Yao, et al., "Stress manipulated coating for fabricating lightweight X-ray telescope mirrors;" Optics Express, vol. 23, No. 22; Oct. 23, 2015.

Yao, et al., "Thermal oxide patterning method for compensating coating stress in silicon substrates;" Optics Express, vol. 27, No. 2; Jan. 14, 2019; 16 pages.

Yao, et al., "Thermal oxide patterning method for compensating coating stress in silicon X-ray telescope mirrors;" Proceedings of SPIE; Jul. 6, 2018; 9 pages.

Zhang, et al., "Monocrystalline silicon and the meta-shell approach to building x-ray astronomical optics;" Proceedings of SPIE; Aug. 29, 2017; 10 pages.

Zuo, et al., "Ultrafast laser Micro-Stressing for Correction of thin fused silica optics for the Lynx X-ray Telescope Mission;" Proceedings of SPIE; Jul. 6, 2018; 13 pages.

\* cited by examiner

STRESS PATTERNING SYSTEMS AND METHODS FOR MANUFACTURING FREE-FORM DEFORMATIONS IN THIN SUBSTRATES

CROSS-REFERENCE TO RELATED APPLICATIONS

This application claims the benefit under 35 U.S.C. § 119 of provisional patent application No. 62/886,499 filed on Aug. 14, 2019, which is hereby incorporated by reference herein in its entirety.

STATEMENT REGARDING FEDERALLY SPONSORED RESEARCH

This invention was made with government support under NNX14AE76G and NNX17AE47G awarded by the National Aeronautics and Space Administration. The government has certain rights in the invention.

BACKGROUND

In in manufacturing of semiconductor devices, the warping of silicon wafers ("wafer warpage") is a well-known problem. Wafer warpage is particularly a problem for certain types of semiconductor devices including NAND flash memory devices and group III-V semiconductor devices.

NAND flash memory is used in many consumer-level electronic products such as desktop computers, tablet computers, smart phones, and many other types of devices. In order to increase storage capacity and reduce bit cost, the structure of NAND flash memories is designed for 3D architecture utilizing die stacking and bonding technology. The bit number per unit area is increased with the number of stacked layers. However, the stresses in layers increase with the number of stacked layers, which can warp wafers and raise misalignment problem between layers in bonding processes, resulting in higher manufacturing cost. It has been shown that the high aspect ratio of 3D stacking structures in NAND flash memory can create saddle-shape distortion which indicates large uniaxial stress exists in layers. Saddle-shape warpage could lead to higher risk of misalignment along one direction and difficulties during bonding/stacking processes. While techniques to correct non-saddle shape distortion are known, there is a need for techniques to correct saddle-shape distortion.

Semiconductors such gallium nitride (GaN), silicon carbide (SiC), and indium gallium phosphide (InGaP) are next generation semiconductor materials which have several advantages such as higher breakdown voltage, wider band gap, and better thermal stability. These materials are suitable for power electrical applications such as MOSFETs and IGBTs in motor controllers and power amplifiers. Computer chips made by GaN have better thermal tolerance which is important for high temperature applications such as in satellites, space stations, and rovers for other planets. The growing of group III-V semiconductors often relies on epitaxy growth on silicon wafers or other substrates. The mismatch of crystal lattice during epitaxy can produce stress which, resulting in wafer warpage. In addition, it has been shown that the stress induced by epitaxy varies for orientation which indicates the stress is not equibiaxial.

Ultra-precision machining of surfaces on thin substrates can have wide applications for space-borne optics and the semiconductor industry. Traditional grinding and polishing methods can have drawbacks and fail to produce the designed topology for an optic or device because of the residual stress relaxation that can be caused by the removal of the material on thin substrates, and the coating and device layer stress-induced distortion that can occur after the post-machining processes. A known way to mitigate coating-stress induced distortion in thin X-ray telescope silicon mirrors with high precision and low cost can be through a surface-stress-based figure correction technique that includes a thermal oxide patterning method.

It is known to use post-correction technologies such as thermal oxide patterning methods to mitigate coating-stress induced distortion on X-ray telescope silicon mirrors. The thermal oxide and the lithographic-based processes used in these processes can often recover the pre-coated mirror shape with a precision of approximately 0.5 arc-second. Although these post-correction technologies can correct much of the coating-induced distortion with high precision, they may not eliminate all figure errors, including the mid-and-low frequency errors introduced by polishing, lapping and grinding. Furthermore, the stress field generated by these methods are incomplete, therefore the technologies cannot be used to reshape the figure of a mirror from a cone to a parabola.

SUMMARY

Described herein are techniques and structures for general stress patterning that can produce a stress field consisting of equibiaxial stress and uniaxial stress. These methods can also produce an arbitrary in-plane stress orientation, called a general stress field, that can be used to induce free-form deformations in thin substrates. These general stress patterns can have a micro fabricated grating area in each unit cell which can generate uniaxial stress with a designed orientation. The patterns can be fabricated using a micro-lithographic process followed by reactive ion etching, for example, which is well known high precision and low-cost process. A calibration process can be performed to map design parameters for the fabricated uniaxial stress and equibiaxial stress. In some embodiments, a general stress pattern can include thermal oxide circles with a rotatable grating area which can precisely control equibiaxial stress, uniaxial stress, and stress orientation. This process can be applied to thin substrates, such as silicon wafers having a thickness of 0.5 mm and a diameter of 100 mm. Disclosed embodiments can produce astigmatism and trefoil deformations not achievable by equibiaxial stress fields alone.

Disclosed embodiments can be used to control deformations in substrates included within semiconductor devices such as NAND flash memory devices and group semiconductor devices. Disclosed embodiments can be used to control the shape of many different types of thin substrate including but not limited to silicon wafers, substrates used in flat panel displays, and Wolter-type silicon X-ray telescope mirrors.

According to one embodiment of the present disclosure, a device can include a substrate and a stressed layer disposed on a first surface of the substrate. The stressed layer can include: a first set of patterns having a predetermined geometry, size, and arrangement selected to control an equibiaxial stress field of the stressed layer, wherein the equibiaxial stress field varies in magnitude over the first surface of the substrate; and a second set of patterns etched into the first set of patterns and the substrate, the second set of patterns comprising a plurality of substantially parallel lines arranged to control at least a uniaxial stress field of the stressed layer, wherein the uniaxial stress field varies in magnitude over the first surface of the substrate.

In some embodiments, the stressed layer can include a thermal oxide. In some embodiments, the stressed layer can include a second stressed layer disposed on a second surface of the substrate opposite from the first surface. In some embodiments, the magnitude and orientation of the uniaxial stress field can vary according to a position on the substrate. In some embodiments, the plurality of substantially parallel lines can include a plurality of substantially parallel grating bars, wherein ones of the plurality of grating bars have an aspect ratio selected to induce a predetermined uniaxial stress within the stressed layer, wherein the aspect ratio for a grating bar is defined as a ratio of the grating bar height divided by the grating bar width. In some embodiments, the aspect ratio can be greater than or equal to 0.1. In some embodiments, the first set of patterns can include one or more geometric regions. In some embodiments, the one or more geometric regions can have varying dimensions. In some embodiments, the second set of patterns can include a first plurality of substantially parallel lines etched into a first one of the one or more geometric regions and a second plurality of substantially parallel lines etched into a second one of the one or more geometric regions, wherein the first and second pluralities of substantially parallel lines have different orientations. In some embodiments, the substrate can include a silicon wafer.

According to another embodiment of the present disclosure, a device can include a substrate and a stressed layer disposed on a surface of the substrate. The stressed layer can include a set of patterns etched into the stressed layer, the set of patterns comprising a plurality of substantially parallel grating bars arranged to control at least a uniaxial stress field of the stressed layer, wherein ones of the plurality of grating bars have an aspect ratio greater than equal to 0.1, wherein the aspect ratio for a grating bar is defined as a ratio of the grating bar height divided by the grating bar width.

According to another embodiment of the present disclosure, a method for fabricating a device can include: etching a first set of patterns into a stressed layer, the first set of patterns configured to control an equibiaxial stress field of the device; and etching a second set of patterns into the etched stressed layer and the substrate, the second set of patterns configured to control a uniaxial stress field of the device.

In some embodiments, etching the second set of patterns can include: using a first method to etch the second set of patterns into the stressed layer; and using a second method to etch the second set of patterns into the substrate. In some embodiments, the first method can include wet etching. In some embodiments, the second method can include wet etching, reactive ion etching or laser cutting. In some embodiments, the first method can include using laser cutting. In some embodiments, etching the second set of patterns can include etching the second set of patterns into the substrate to a depth dictated by a predetermined aspect ratio.

BRIEF DESCRIPTION OF THE DRAWINGS

The manner of making and using the disclosed subject matter may be appreciated by reference to the detailed description in connection with the drawings, in which like reference numerals identify like elements.

The drawings are not necessarily to scale, or inclusive of all elements of a system, emphasis instead generally being placed upon illustrating the concepts, structures, and techniques sought to be protected herein.

DETAILED DESCRIPTION

Figure 1:
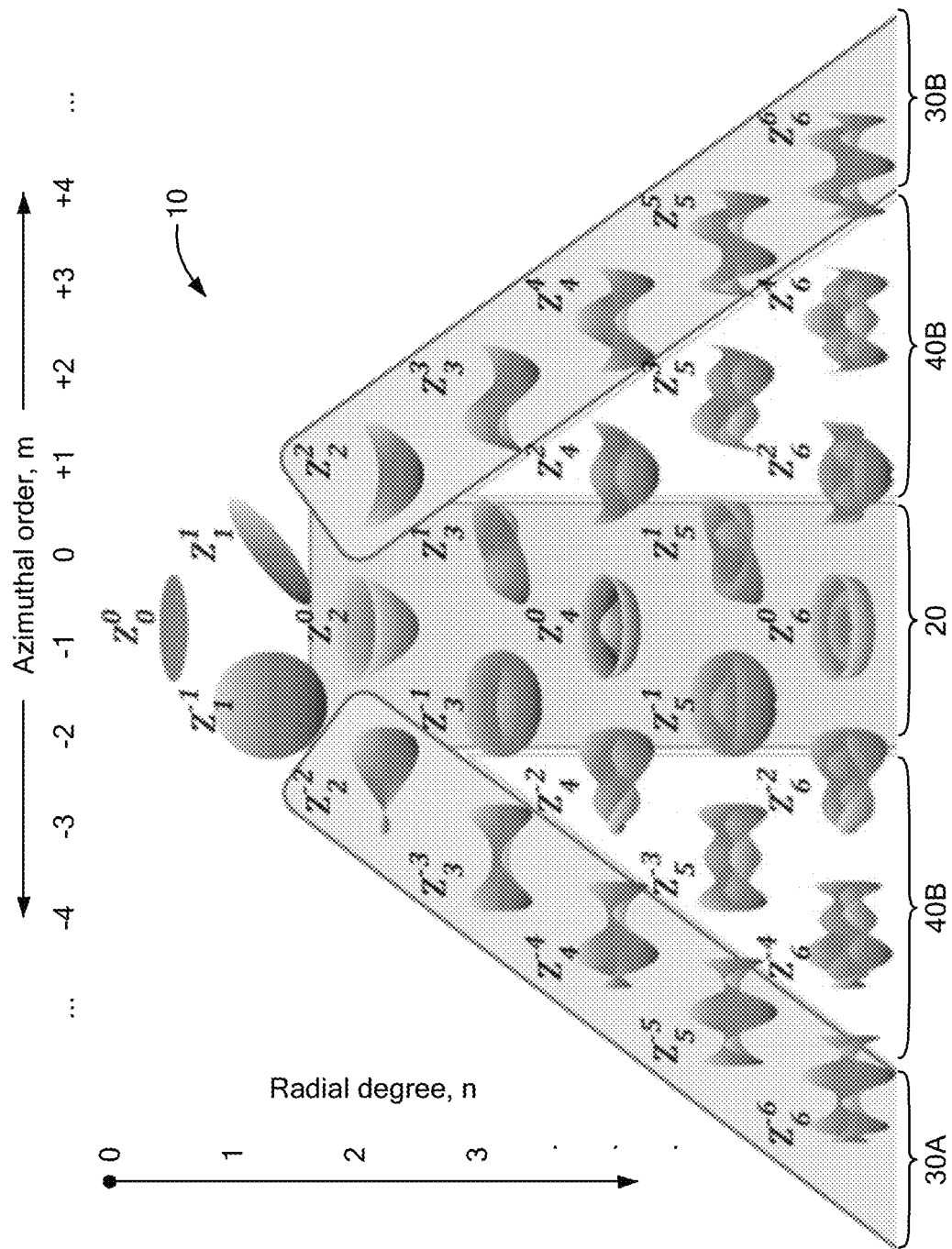
FIG. 1 is a diagram showing deformations in thin substrates represented by Zernike polynomials.

Turning to FIG. 1, a general stress field in a thin substrate or film is comprised of three components: uniaxial stresses along two principal directions in xy plane ($S_{xx}$ and $S_{yy}$) and shear stresses ($S_{xy}$). The stress field can be translated to an x'y' plane with a new orientation θ, where the shear stress can be zero. The translation can be expressed in a matrix form as:

$$\begin{Bmatrix} S_{xx'} \\ S_{yy'} \\ 0 \end{Bmatrix} = \begin{Bmatrix} \cos^2(\theta) & \sin^2(\theta) & 2\cos(\theta)\sin(\theta) \\ \sin^2(\theta) & \cos^2(\theta) & -2\cos(\theta)\sin(\theta) \\ -\cos(\theta)\sin(\theta) & \cos(\theta)\sin(\theta) & \cos^2(\theta) - \sin^2(\theta) \end{Bmatrix} \begin{Bmatrix} S_{xx} \\ S_{yy} \\ S_{xy} \end{Bmatrix} \quad (1)$$

When $S_{xx'}=S_{yy'}$, the stress can be referred to as equibiaxial stress, which is a stress that can be realized in, for example, iridium coatings and thermal oxide layers on X-ray telescope silicon mirrors. When $S_{xx'}=-S_{yy'}$, the stress can be referred to as antibiaxial stress. When there is only one principal stress in the stress field while all other stresses are zero, the stress can be called a uniaxial stress. Any stress can be expressed as a linear combination between an equibiaxial stress and a uniaxial stress with its orientation, expressed as $[S_{xx'}, S_{yy'}, 0]=[S_{yy'}, S_{yy'}, 0]+[S_{xx'}-S_{yy'}, 0, 0]$.

Equibiaxial stress in surface coatings can create limited deformations represented by the Zernike polynomials, illustrated as a pyramid 10 in FIG. 1. Equibiaxial stress fields can generate deformations shown in the center region 20 (i.e., the center three columns of pyramid 10). The profiles in shoulder areas 30A and 30B can be generated by anti-biaxial stress fields, while the profiles in other areas 40A and 40B (i.e., the areas between center region 20 and shoulder areas 30A, 30B) require a linear combination of those two kinds of the stress fields. Previously developed patterning methods, such as those using thermal oxide patterns, can create substrate deformations using equibiaxial stress fields, and can therefore compensate the coating stress in iridium or other metal coatings which are also equibiaxial. These patterns, however, often cannot create complete deformations and therefore cannot correct for general random errors on thin substrates such as semiconductor wafers and X-ray telescope mirror surfaces.

Figure 2A:
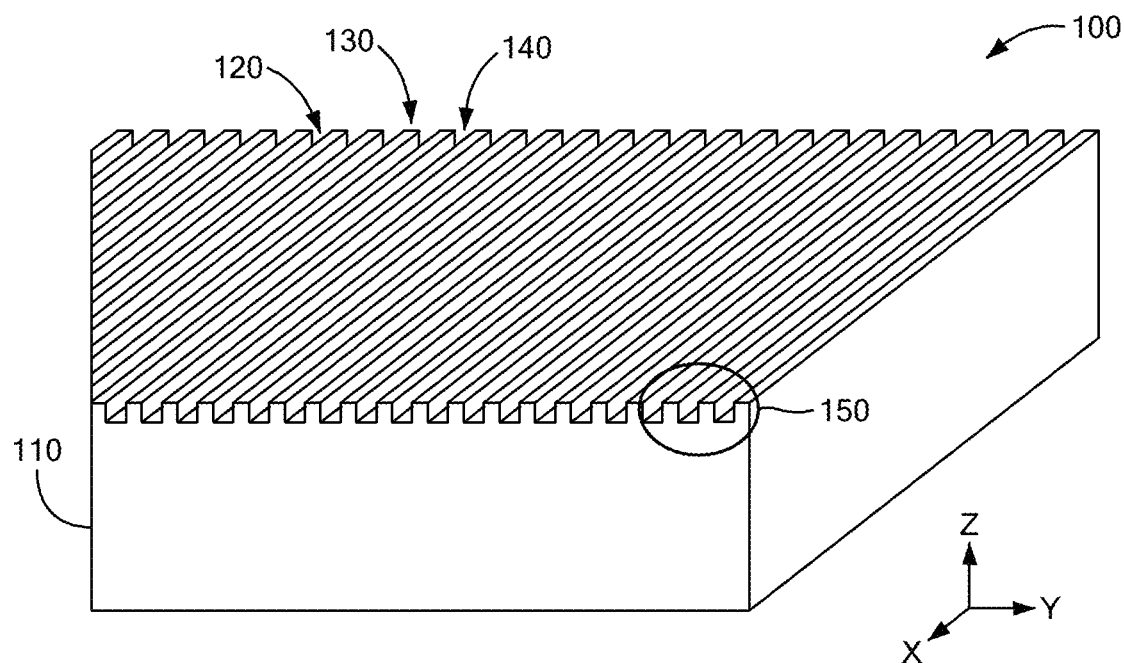
FIG. 2A is a perspective view of a device comprising a substrate and a stressed layer disposed on a surface of a substrate, according to some embodiments.
Figure 2B:
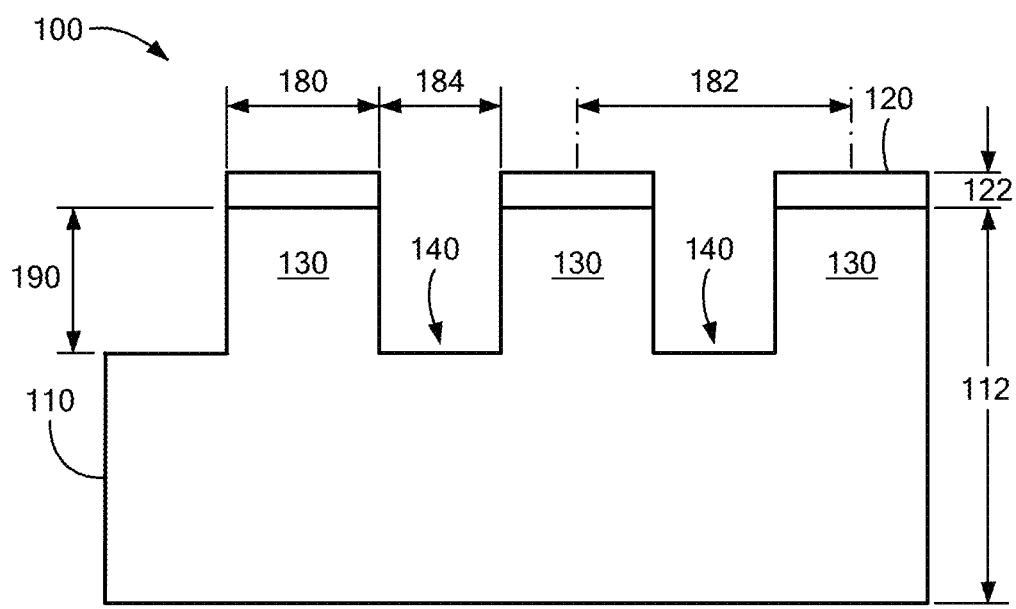
FIG. 2B is a magnified side view of the device illustrated in FIG. 2A.

Turning to FIGS. 2A and 2B, an illustrative device 100 can include a substrate 110 and a stressed layer 120 disposed thereon. FIG. 2B shows a magnified side view of the device 100 corresponding to circled region 150 in FIG. 2A. Substrate 110 can comprise silicon or any other suitable material. In some embodiments, substrate 100 can have a thickness 112 within a range of 100 to 1000 μm. In particular embodiments, substrate 100 can have a circular shape with a thickness of about 0.5 mm and a diameter of about 100 mm. Stressed layer 120 can comprise a thermal oxide, a metal film, a dielectric film, or any other material suitable for creating a stressed layer according to the techniques disclosed here. In some embodiments, stressed layer 120 can have a thickness 122 of about one (1)μm. The various dimensions discussed herein are shown in FIG. 2B.

Formed within the substrate 110 are a plurality of raised linear structures ("grating bars") 130 separated by trenches 140 that together form a grating pattern or structure. For clarity, only one grating bar 130 and one trench 140 are labeled in FIG. 2A. The grating structure can be created using techniques described below. The grating bars 130 can be arranged substantially parallel to each other and extend in a single direction, such as along the X-axis as shown in FIG. 2A. Grating bars 130 can have a uniform width 180, a uniform height 190, and can be separated by a uniform pitch 182. As used herein, "pitch" can refer to the length from one midpoint of a linear or geographical structure to the midpoint of an adjacent linear or geographical structure. In some embodiments, the pitch 182 can be about 50 μm. In some embodiments, the pitch 182 of the lines can be about 10 μm. The trenches 140 can have a substantially uniform width 184 and a depth 190 that extends into a top surface of the substrate 110.

The top of grating bar 130 can be coated with a layer of thermal oxide or other material (i.e., stressed layer 120) that generates compressive or tensile surface stress. An individual grating bar 130 and the portion of the stressed layer 120 disposed thereover is referred to as a tooth. Each tooth can have a uniform width equal to the grating bar width 180 and a uniform height equal to the sum of the grating bar height 190 and the stressed layer thickness 122. Due to the discontinuity of the grating structure along one direction (e.g., the Y-axis in FIG. 2A), the stress along this direction can be controlled based on the grating pattern.

It is appreciated herein that amount of stress induced along the Y-axis is determined, in significant part, by the aspect ratio (AR) of tooth height to tooth width (i.e., AR=tooth height/width). To create uniaxial stress, it may be desirable to have the aspect ratio of the grating bars 130 is close to one (1). The techniques disclosed herein can make it easier to realize such an aspect ratio, even where the stressed layer 120 is very thin (e.g., less than 10 μm). In some embodiments, grating bars 130 can have an aspect ratio greater than or equal to 0.1. In some embodiments, grating bars 130 can have an aspect ratio greater than or equal to 0.2.

Figure 3A:
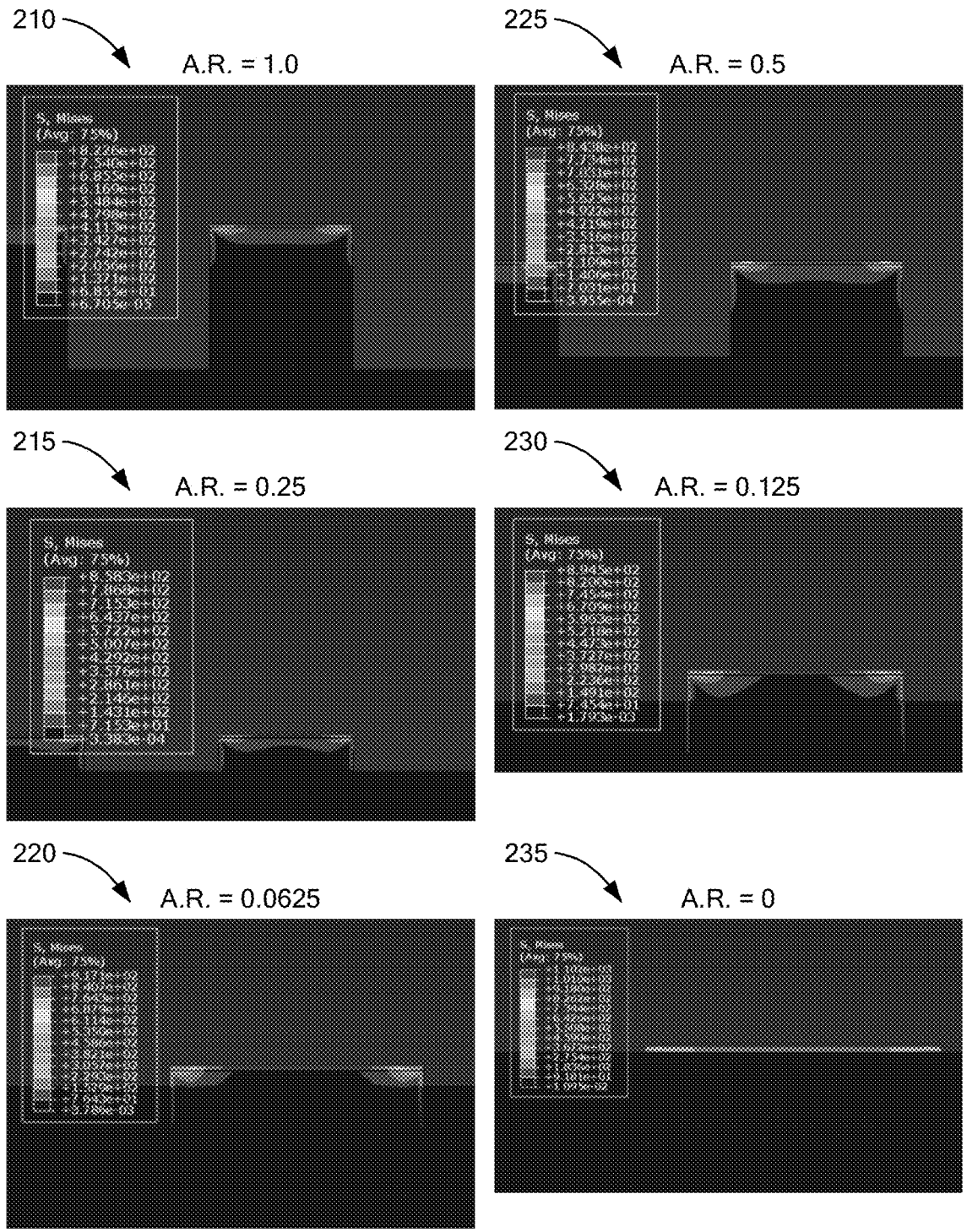
FIG. 3A is a series of graphical representations of grating bars having different aspect ratios.

Illustrated in FIG. 3A are embodiments of finite element models for grating bars having different ARs. The illustrated grating bars may be the same as or similar to a grating bar 130 shown in FIGS. 2A and 2B. The models in FIG. 3A were created with a device that has a 500 μm-thick silicon wafer. On the top surface of the device there is a grating structure with a fixed pitch of 50 μm and a fixed trench width of 25 μm. A stressed layer (e.g., an oxide layer) is applied on top of each grating bar or tooth. In these examples, the stressed layer is 1 μm thick and has an equibiaxial stress of 1 GPa. Illustrated are six different models with different ARs: a first model 210 where the AR is one (1); a second model 215 where the AR is 0.25; a third model 220 where the AR is 0.0625; a fourth model 225 where the AR is 0.5; a fifth model 230 where the AR is 0.125; and a sixth model 235 where the aspect ratio is zero. As shown in FIG. 3A, each tooth may have a relaxed stress at the upper corners of each tooth which becomes greater as the AR increases. These six different models can be used to demonstrate the relationship between the grating bar AR to the stress created by the grating bars over a surface area by calculating the curvature of a back surface of the device along the Y-axis.

Figure 3B:
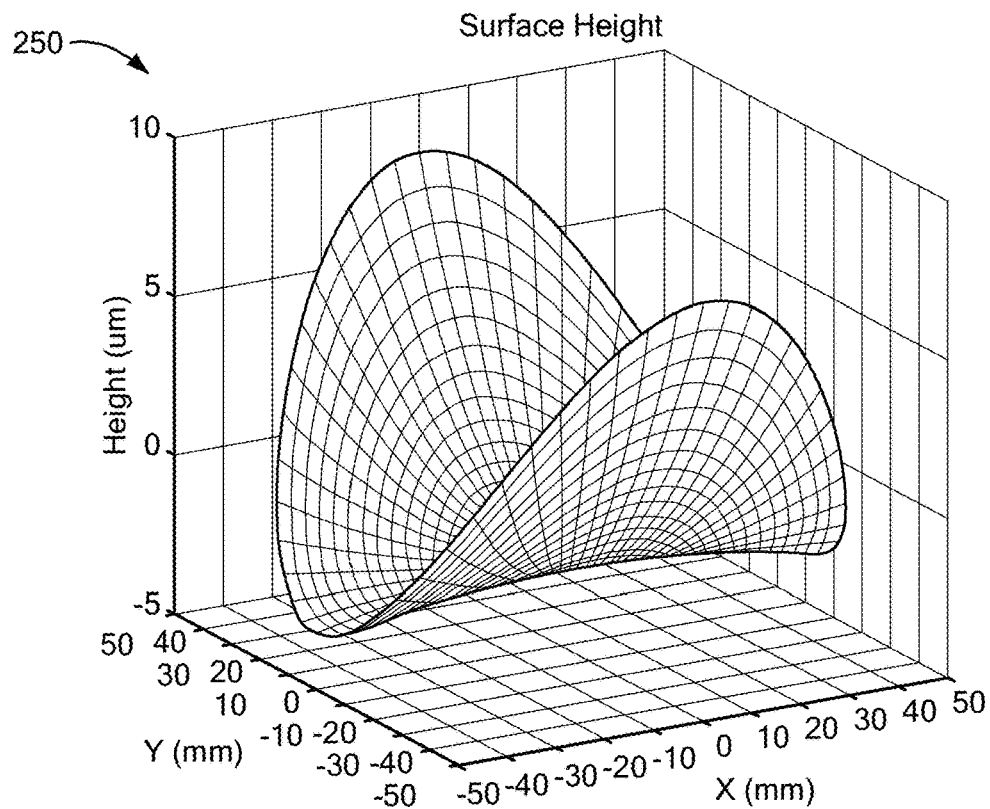
FIGS. 3B and 3C are graphical representations of measured deformation patterns.
Figure 3C:
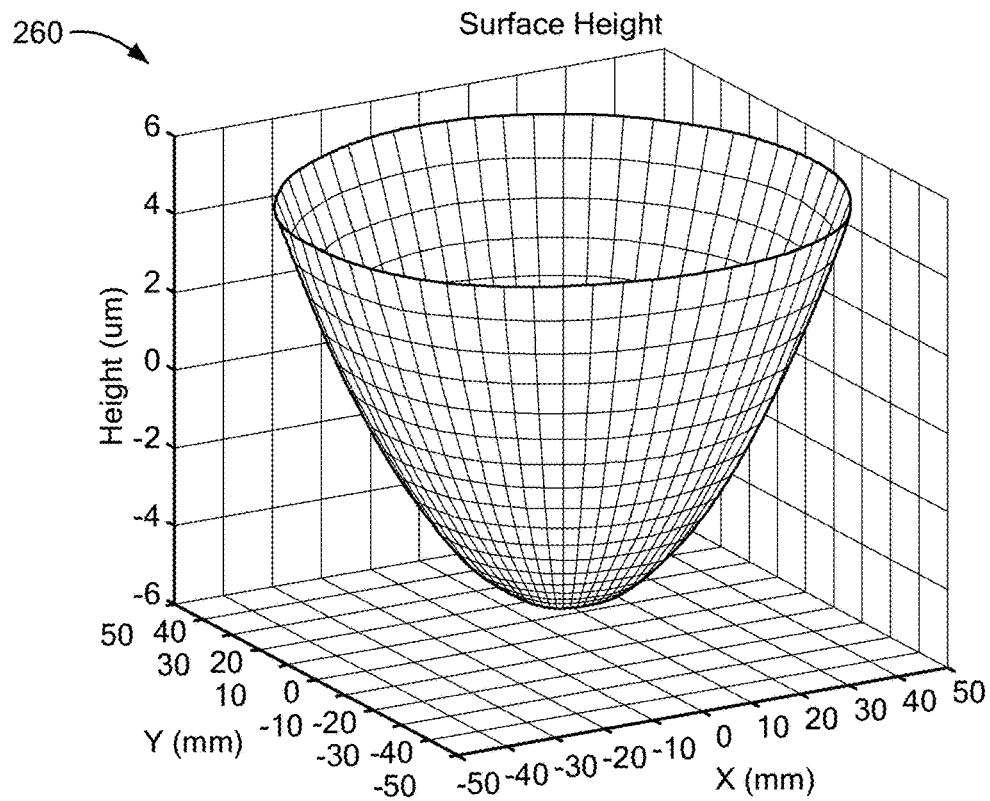

FIG. 3B illustrates deformation 250 that can be caused by applying a grating pattern wherein the grating bars have an AR of one (1) to a substrate. The grating bars can be fabricated into a stressed layer disposed over the substrate according to disclosed embodiments. As shown, with an AR of one (or close to one), the stress along a direction normal to the grating bar (e.g., the X-axis) is relaxed. By contrast, FIG. 3C illustrates deformation 260 that can be caused by applying a grating pattern wherein the grating bars have an AR of zero (0) to a substrate.

Figure 4:
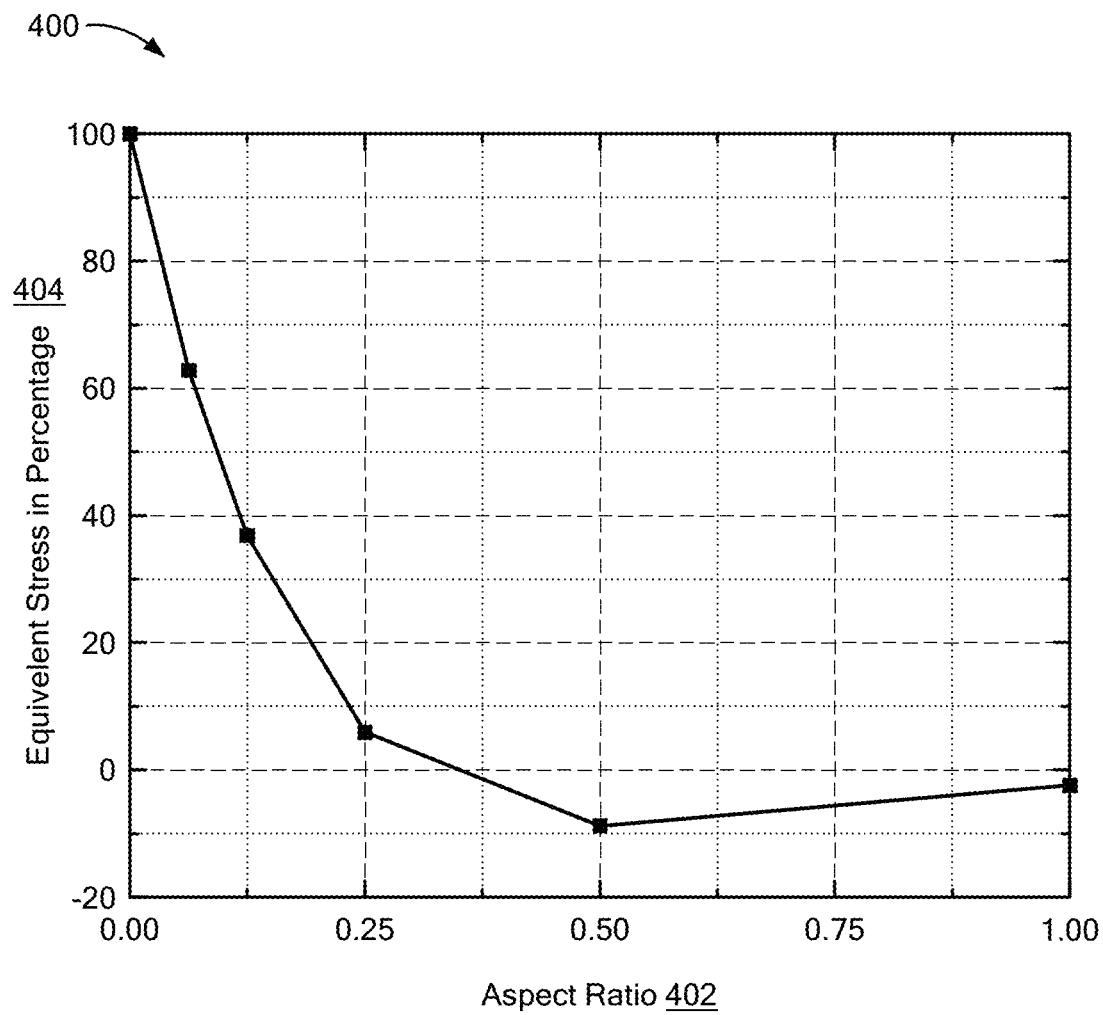
FIG. 4 is a plot illustrating grating bar aspect ratio versus equivalent stress.

FIG. 4 shows a plot 400 of grating bar AR 402 to percent equivalent stress 404 created by a grating pattern having the corresponding grating bar AR. The vertical axis 404 of plot 400 may be referred to as "equivalent residual stress," which is the ratio of stress normal to the grating bars to the stress obtained with an aspect ratio 402 of zero (0). The plot 400 is normalized such that there is 100% residual stress 404 when the grating bars have an aspect ratio 402 of zero (0), or when the stressed layer comprises no patterning. Plot 400 demonstrates that the equivalent residual stress 404 decreases to zero when the aspect ratio 402 is around 0.3, and that the equivalent residual stress turns to tensile stress when the aspect ratio 402 is larger than 0.3. This may result from the fact that, when the tooth is sufficiently tall compared with the width, the stretching from the stressed layer can be translated as a squeezing trend at the base of each grating bar, which can generate a tensile stress on the substrate.

Figure 5:
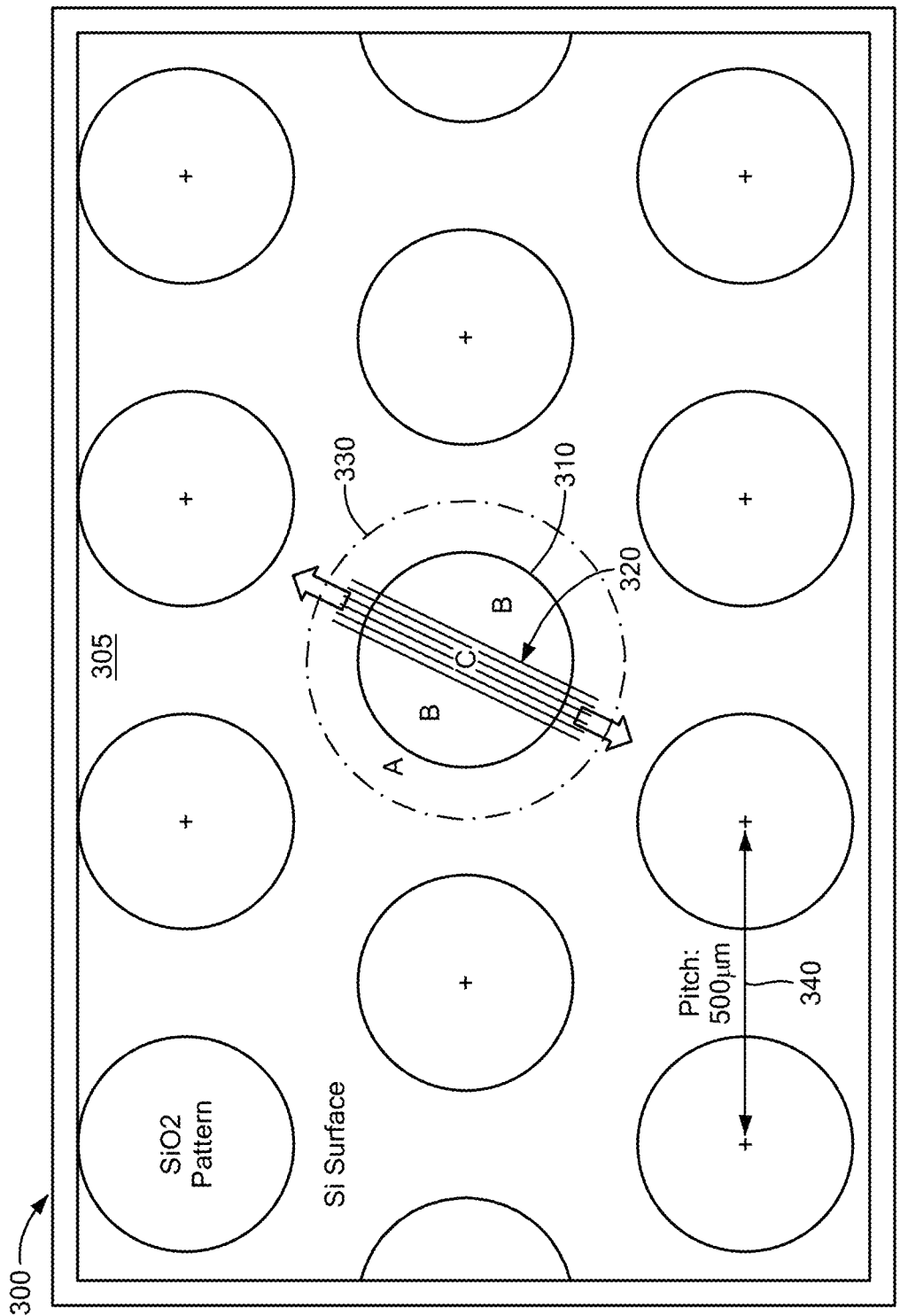
FIG. 5 is a top view of a device with a general stress pattern, according to some embodiments.

FIG. 5 shows an example of a general stress pattern applied to a substrate to control equibiaxial stress, uniaxial stress, and axial orientation, according to some embodiments. A device 300 includes a substrate 305 which can be silicon or another suitable material. The general stress pattern is comprised of circular regions (or "unit cells") 310 of a stressed layer material (e.g., thermal oxide) disposed on a surface of the substrate 305. There are 13 unit cells 310 shown in FIG. 5, however, for clarity, only one unit cell 310 is labeled.

The unit cells 310 can be separated from one another by a pitch 340. In some embodiments, the pitch 340 can be approximately 500 μm. The size of each unit cell 310 can vary (e.g., by varying the diameter of the circular region) up to a maximum size denoted by circular dashed line 330. The maximum size of a unit cell 310 is herein denoted Area A.

Grating bars 320 can be etched into the unit cells 310. Grating bars 320 can be similar to grating bars 130 of FIGS. 2A and 2B. The area of a unit cell 310 occupied by grating bars 320 is herein denoted Area C. Within this arrangement, the portion of a unit cell 310 without grating bars (denoted Area B) produces equibiaxial stress, while the portion of the unit cell 310 with grating bars (Area C) produces uniaxial stress. In each unit cell 310, the size of region B can be varied to produce different magnitudes of equibiaxial stress. Also in each unit cell 310, the size of region C can be varied to produce different magnitudes of uniaxial stress. Further, in each unit cell 310, the grating bars can be rotated around a center point to produce different orientations of uniaxial stress. In addition, the size of the grating bar area (Area C) can vary between unit cells, e.g., by increasing the number of grating bars, or the width or pitch of the grating bars. In some embodiments, grating bars 320 can be formed using an ME-etching process. In some embodiments, the pitch between the grating bars can be about 10 μm.

To quantitatively design a general stress pattern, two parameters can be used: duty cycle (DC) and area fraction (AF). These parameters can be defined as follows:

$$DutyCycle = \frac{Area\,B + Area\,C}{Area\,A + Area\,B + Area\,C} \quad (2)$$

$$AreaFraction = \frac{Area\,C}{Area\,B + Area\,C}$$

By adjusting DC, AF, and the grating bar orientation, a complete general stress field can be induced over a substrate. The general stress pattern illustrated in FIG. 5 is merely one example of a pattern that can be used to generate a general deformation of a substrate according to the concepts and techniques disclosed herein.

Figure 6A:
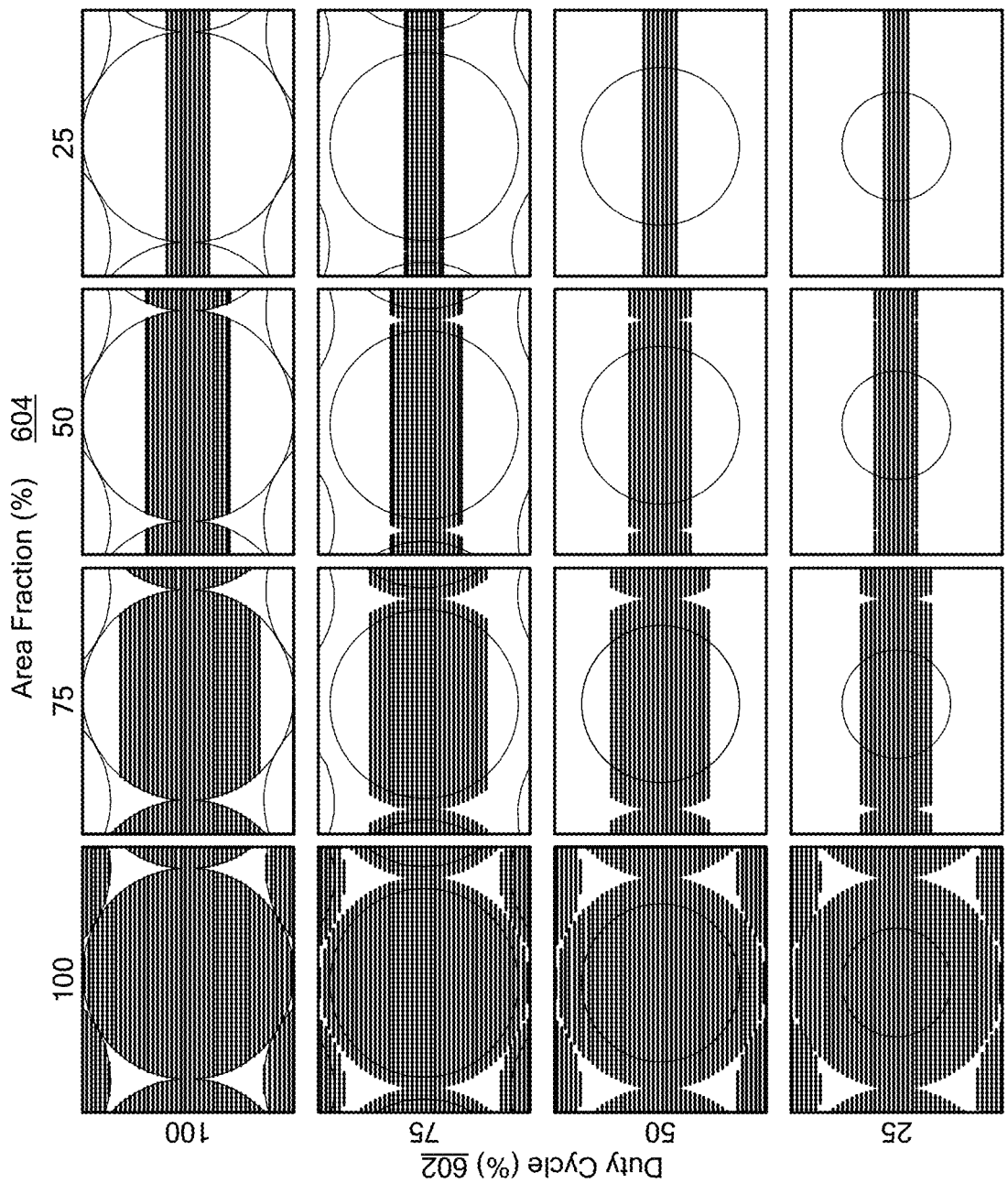
FIGS. 6A-6C illustrate the results of varying design parameters of the general stress pattern shown in FIG. 5.
Figure 6B:
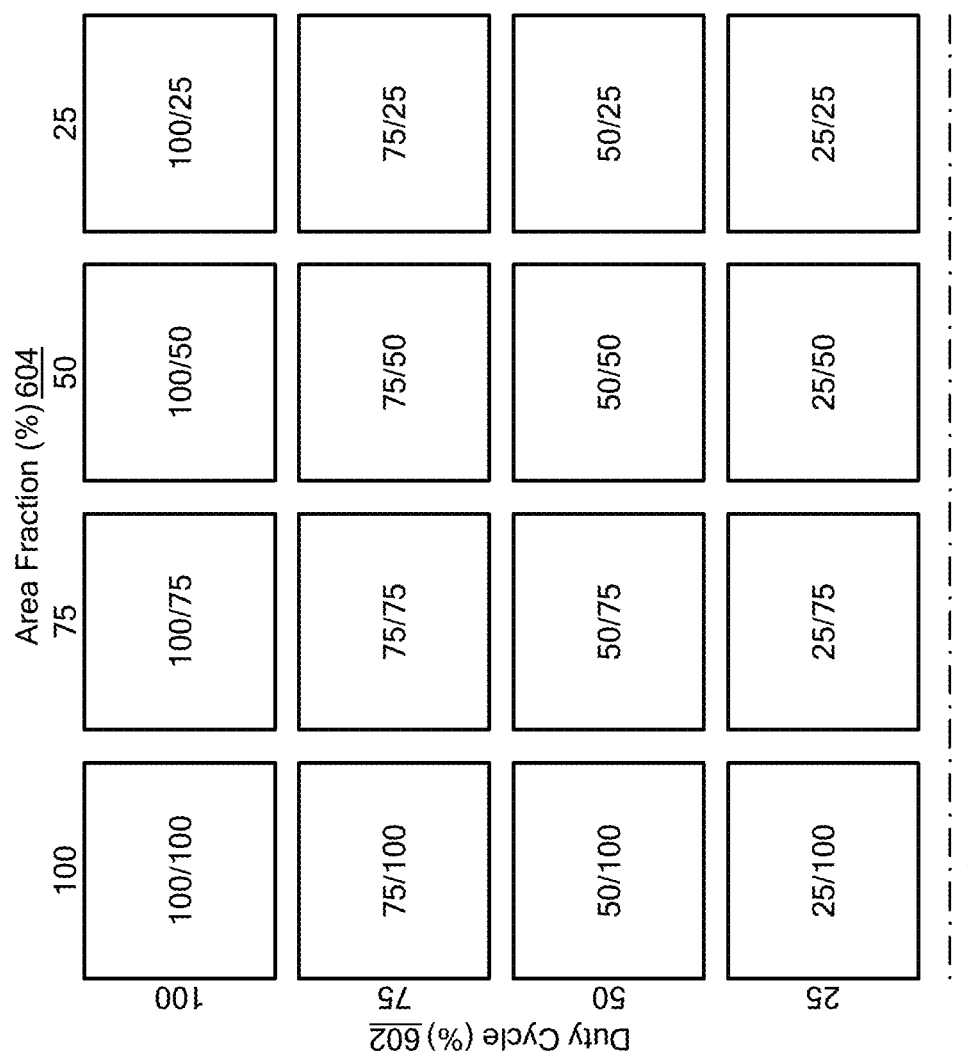
Figure 6B:
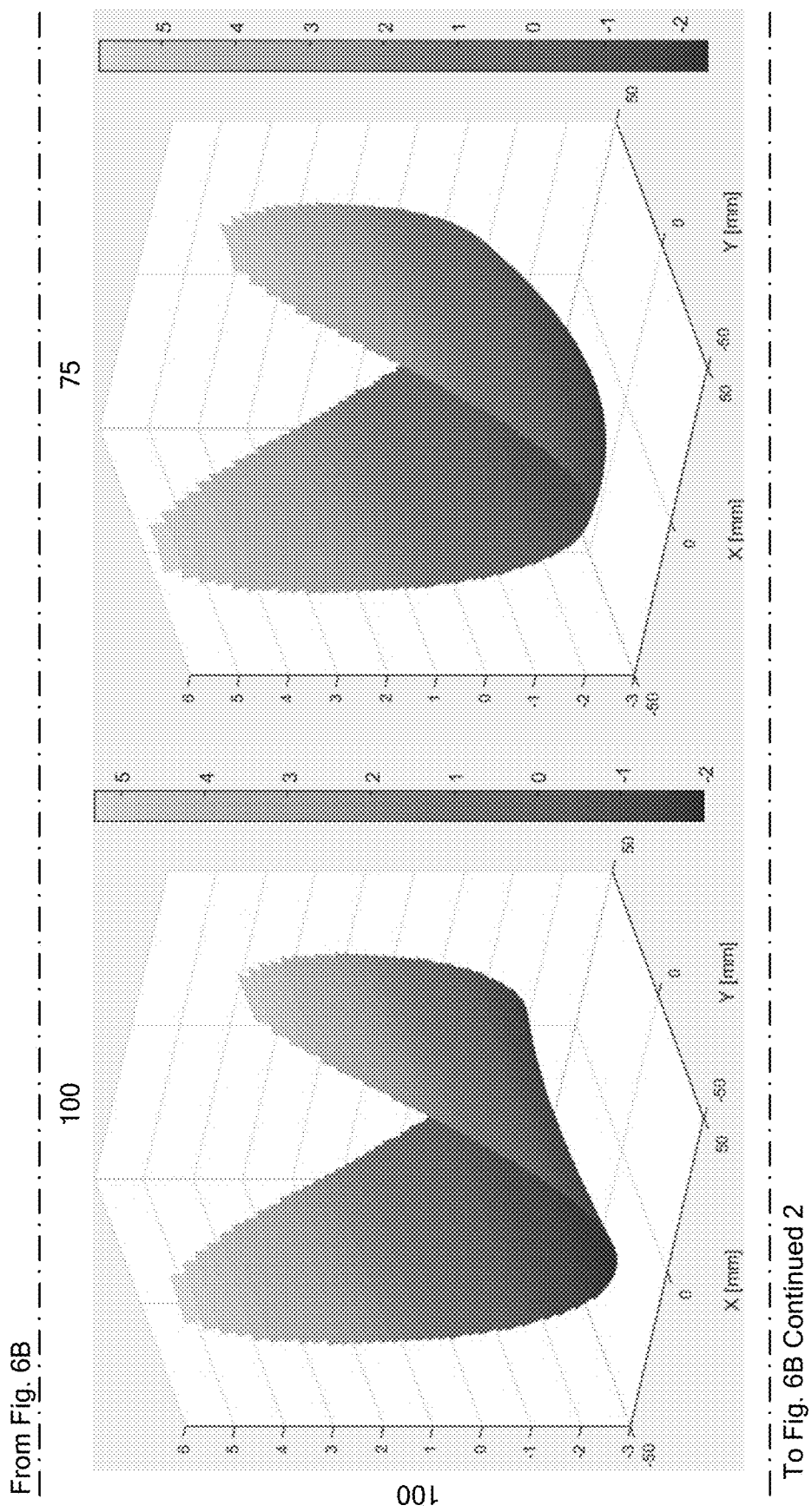
Figure 6B:
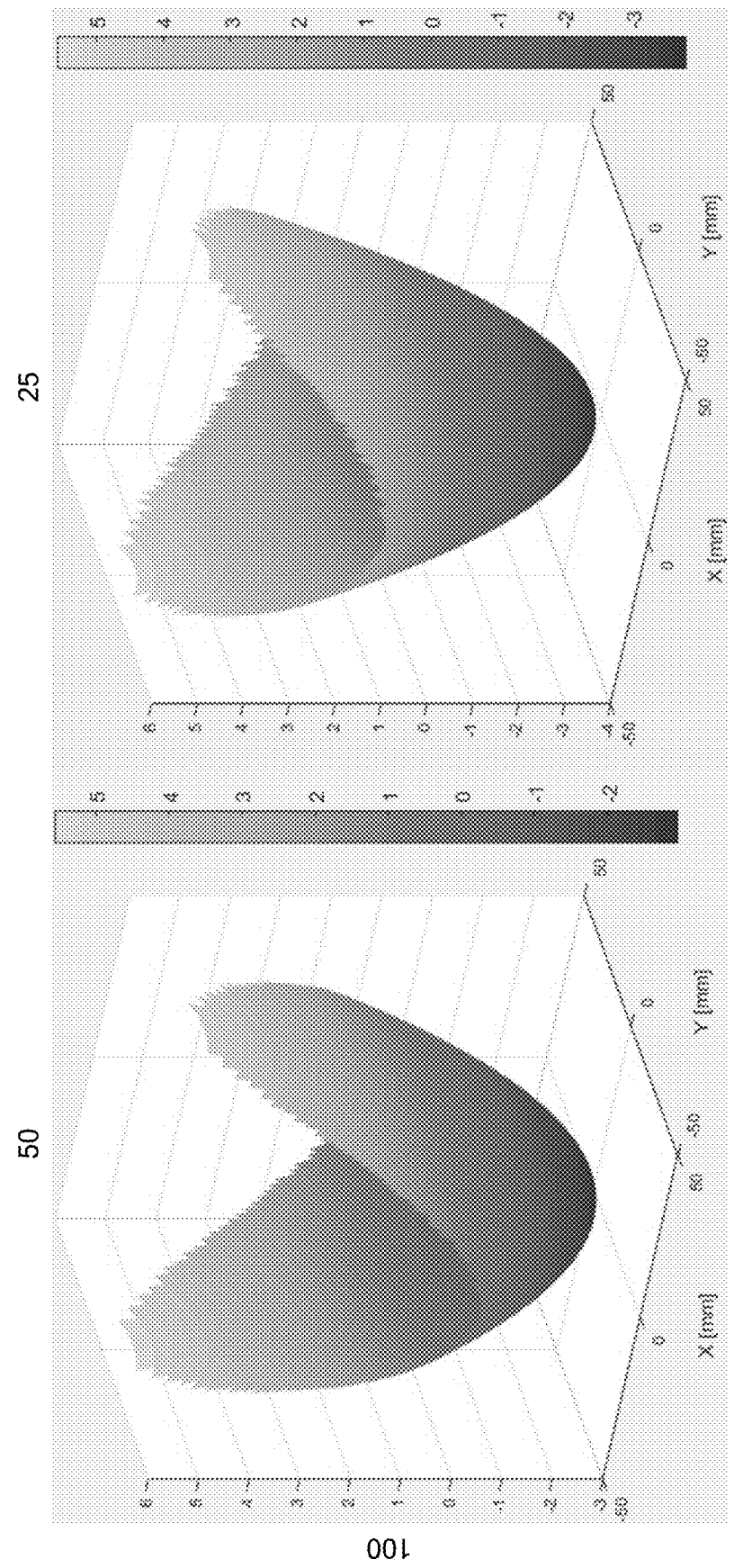
Figure 6B:
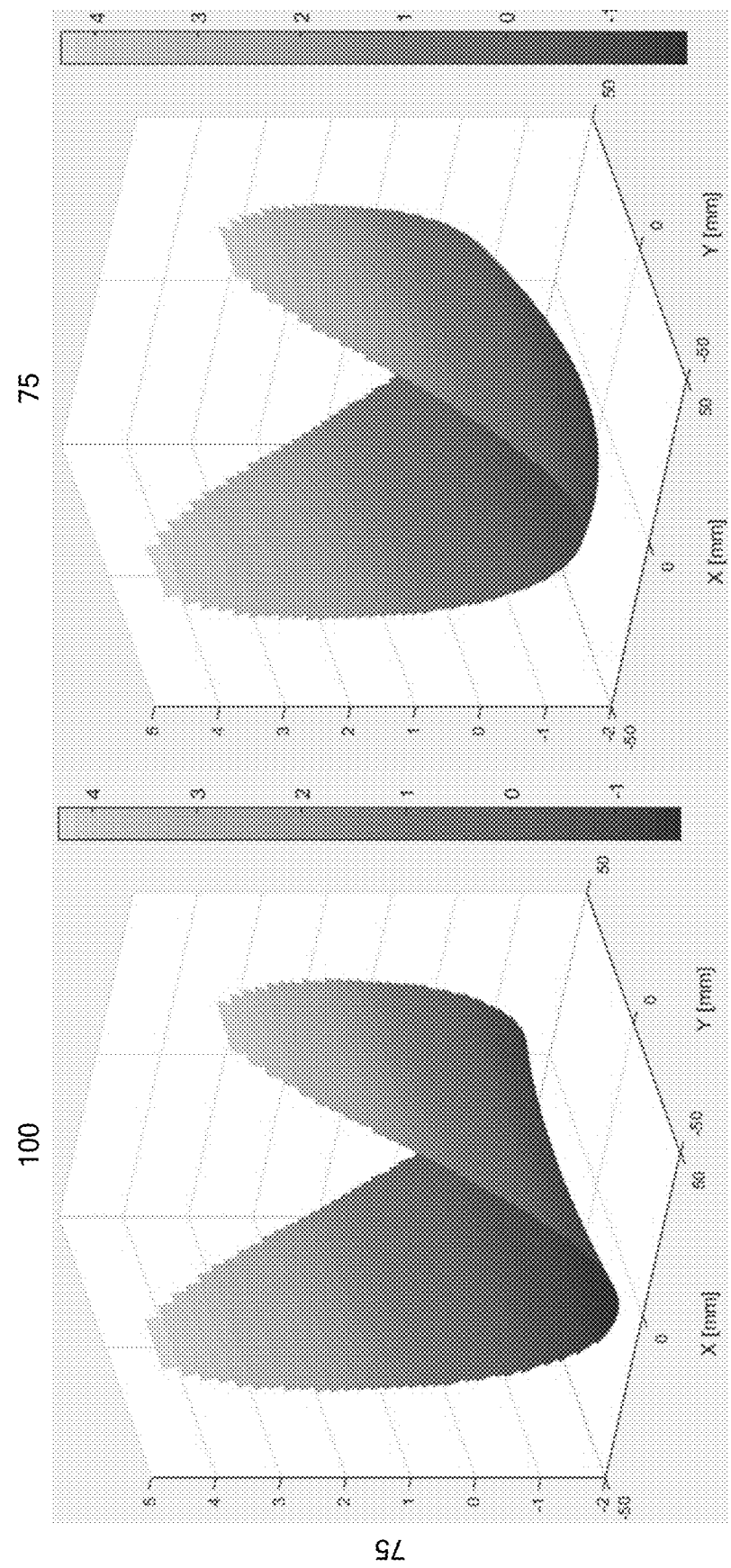
Figure 6B:
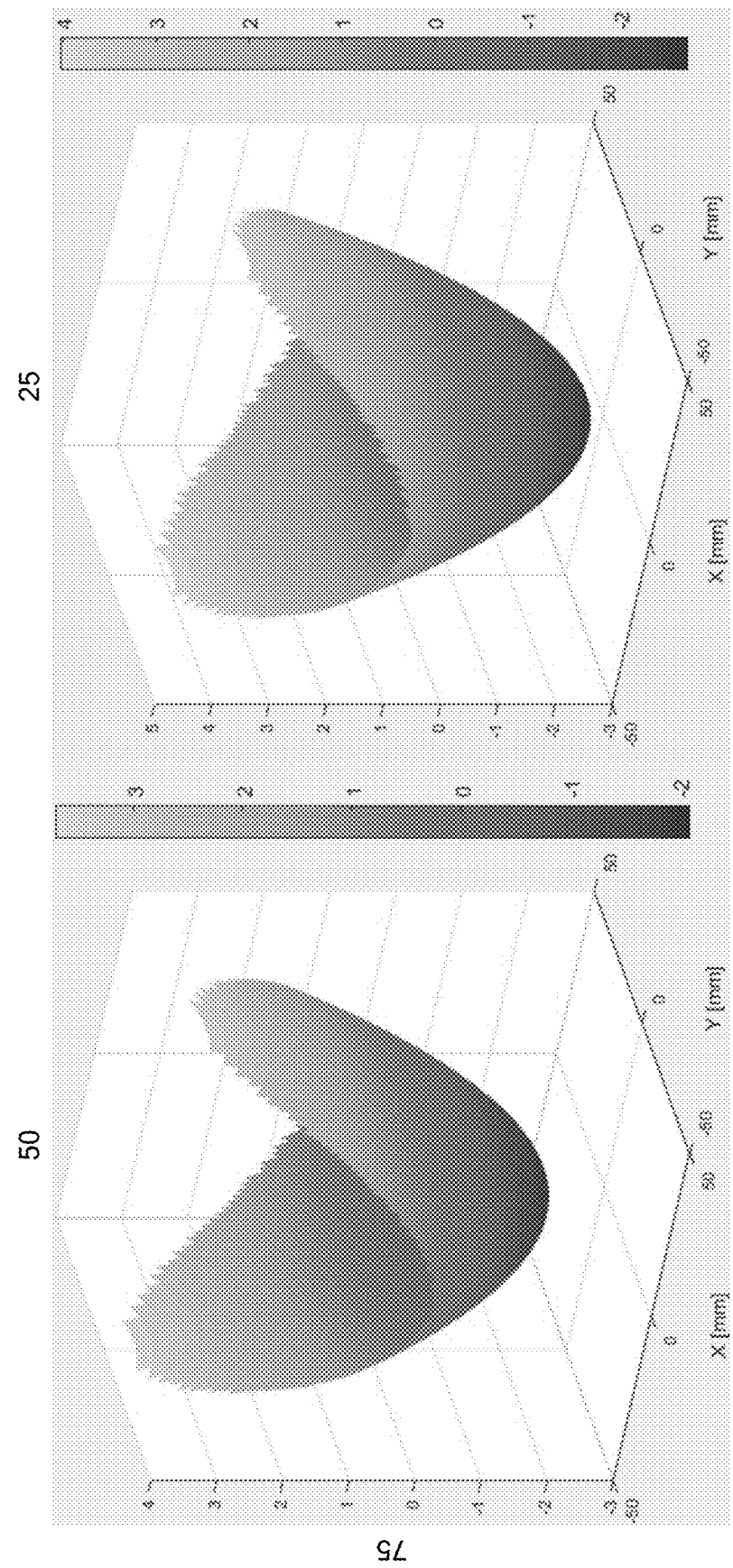
Figure 6B:
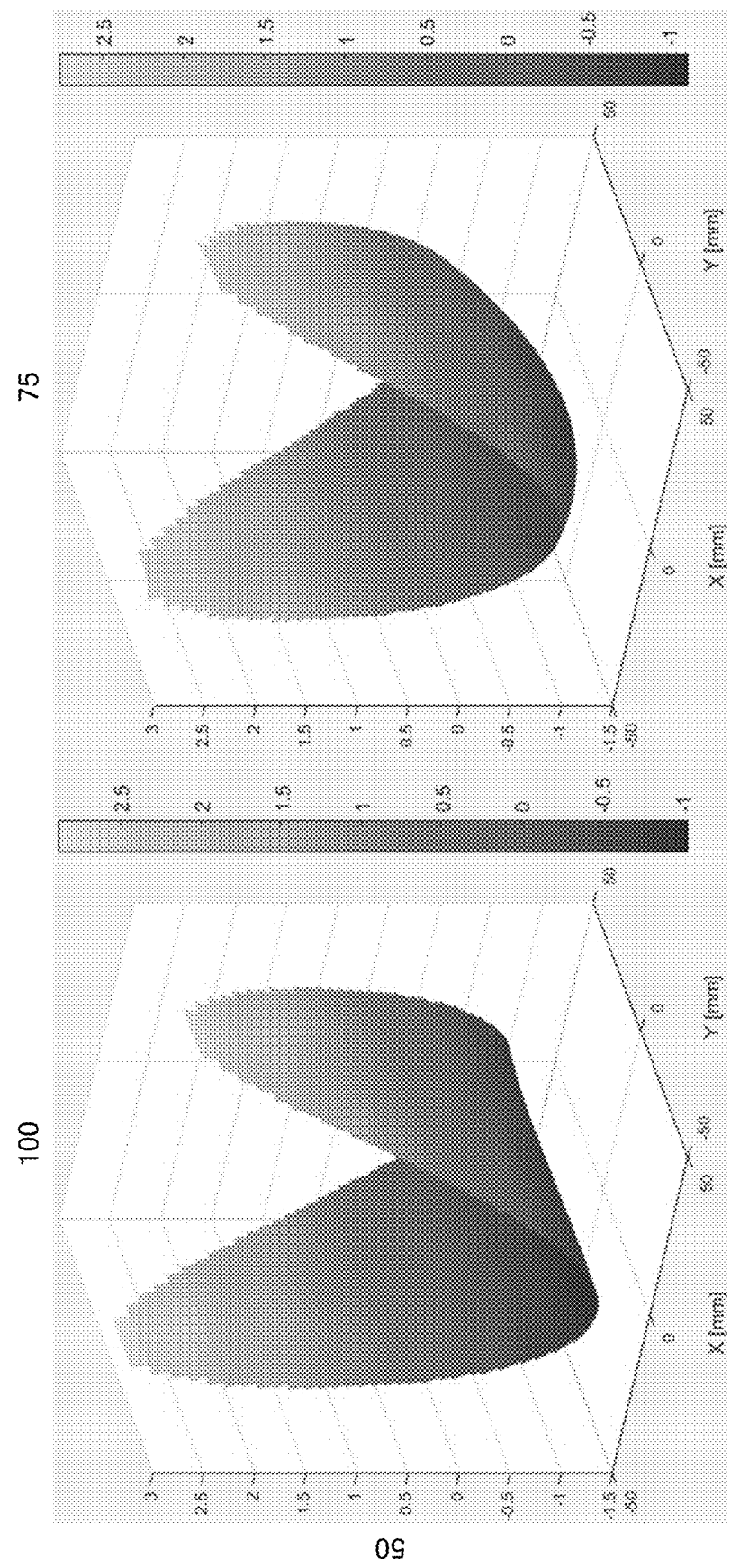
Figure 6B:
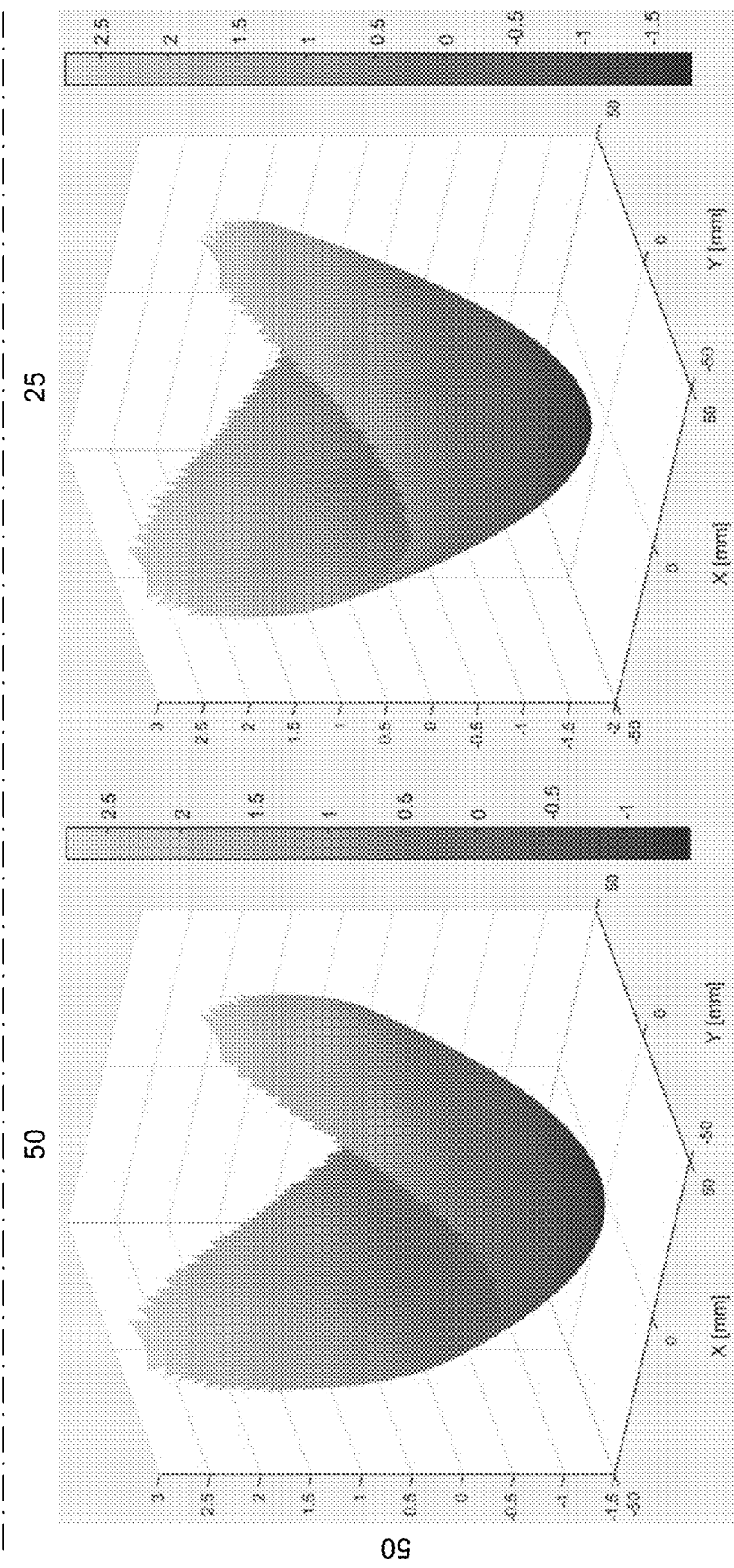
Figure 6B:
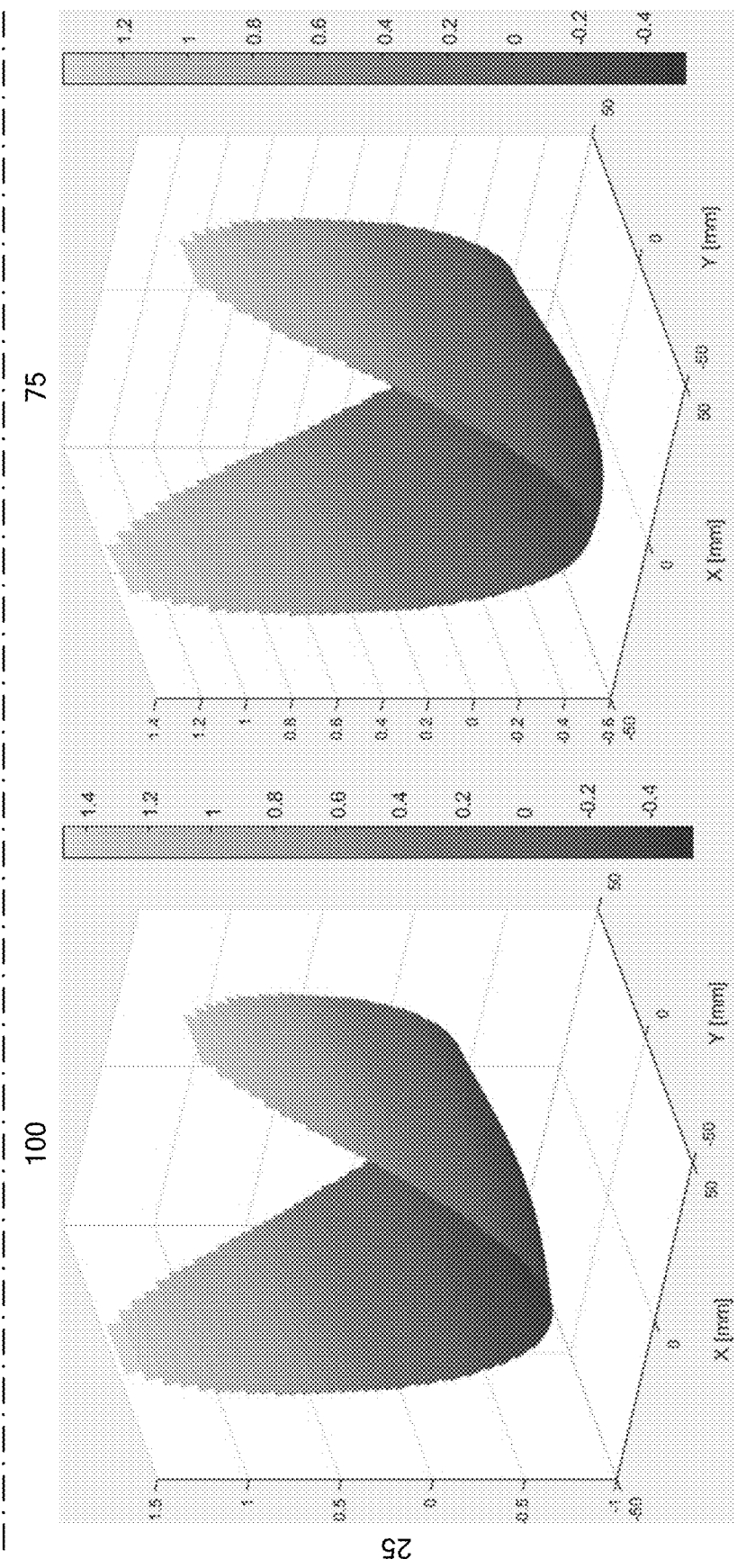
Figure 6B:
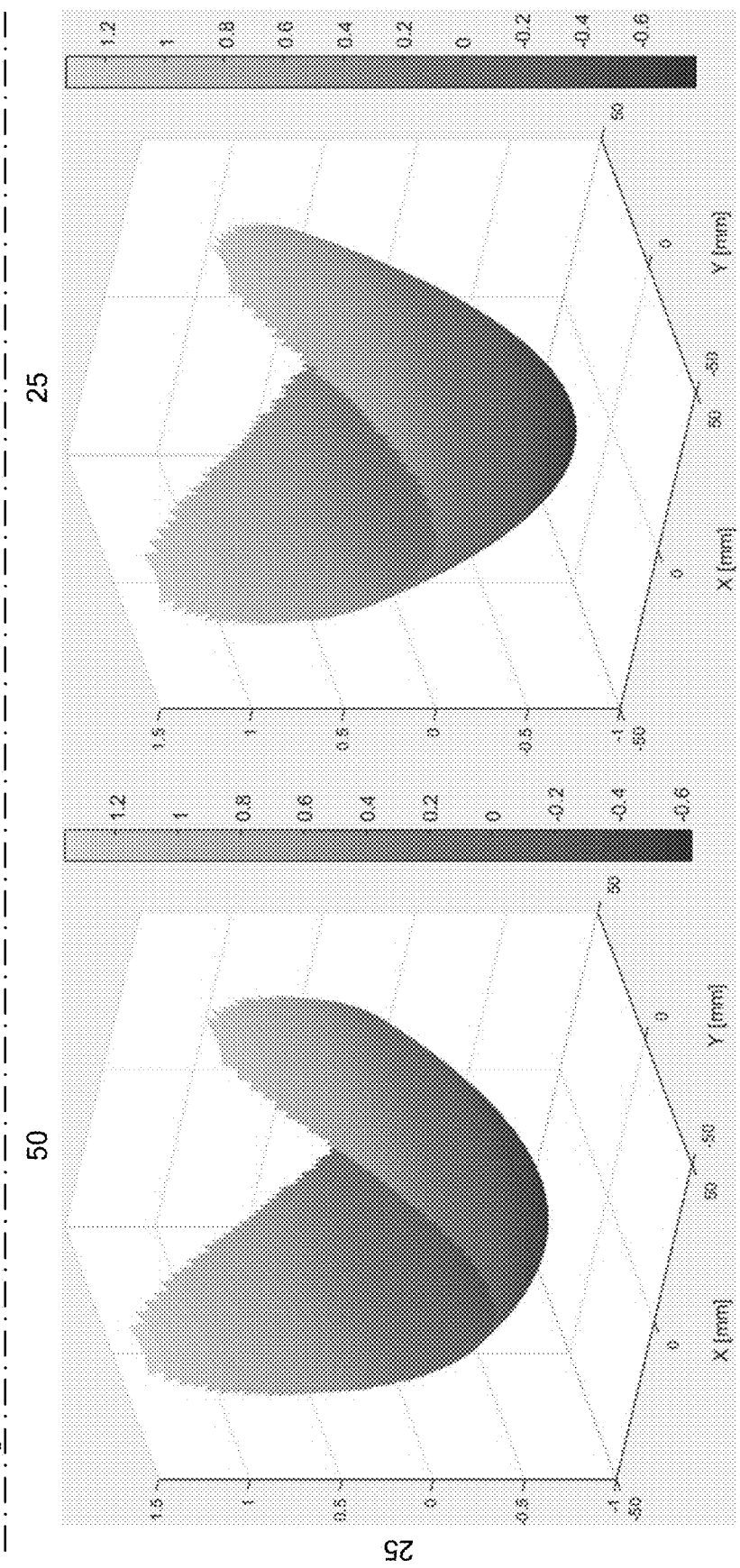
Figure 6C:
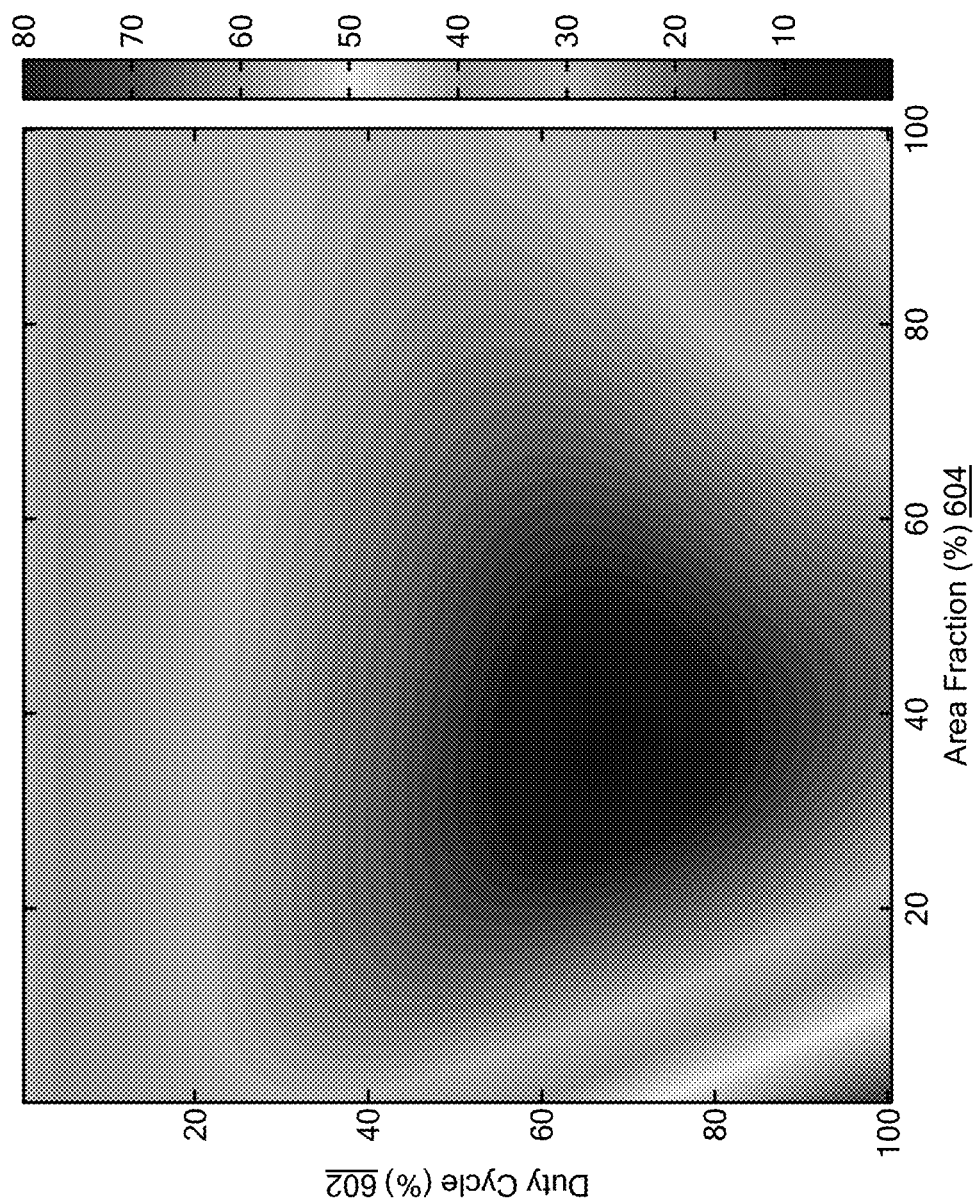

FIGS. 6A-6C illustrate the results of varying the DC 602 and AF 604 parameters for a unit cell of a general stress pattern (e.g., a unit cell 310 in FIG. 5).

FIG. 6A shows optical micrographs of sixteen samples with different sets of DC 602 and AF 604 parameters. The deformation produced by each set of parameters was measured and the resulting calculated and normalized stresses (i.e., normalized by the stress when AC=100% and AF=0%) were used to generate the calibration maps illustrated in FIG. 6B.

FIG. 6B illustrates the measured deformation of samples with the patterns corresponding to the structures in FIG. 6A. In the calibration maps, the deformations were fitted by finite element models, and stresses were calculated to create one or more matrices having values that represent the normalized equibiaxial and uniaxial stress. As shown in FIG. 6, in the case where AF=100%, stress normal to the grating bars is thoroughly relaxed.

The process of generating a general stress field on a substrate can include converting the general stress field to a DC and AF for fabrication using a so-called "Merit Matrix":

$$Merit\,Matrix = \begin{pmatrix} (a_{1,1} - A_0)^2 & \ldots & (a_{1,1000} - A_0)^2 \\ \vdots & \ddots & \vdots \\ (a_{1000,1} - A_0)^2 & \ldots & (a_{1000,1000} - A_0)^2 \end{pmatrix} + \quad (3)$$

-continued $$\begin{pmatrix} (b_{1,1} - B_0)^2 & \ldots & (b_{1,1000} - B_0)^2 \\ \vdots & \ddots & \vdots \\ (b_{1000,1} - B_0)^2 & \ldots & (b_{1000,1000} - B_0)^2 \end{pmatrix},$$

where $A_0$ and $B_0$ are target equibiaxial and uniaxial stresses, $a_{i,j}$ is the element in matrix, and $b_{i,j}$ is in matrix B. The Merit Matrix according to equation (3) represents the merit of the stresses for the DC and AF regarding the target stresses. The index of the minimum element in Merit Matrix represents the DC and AF to be selected for a pattern. As an example, for a stress pattern which produces 30% equibiaxial and 30% uniaxial stress, the Merit Matrix is plotted in FIG. 6C. By searching for the minimum, it can be determined that the corresponding DC and AF values are 68% and 37.5%, respectively.

FIGS. 7A-7L illustrate a process for patterning a general stress field on a substrate such as a silicon wafer, a Wolter-type silicon X-ray mirror, or other substrate. While this process illustrates a lithographic process, it should be appreciated that any suitable process can be used to pattern general stress fields according to the present disclosure. The illustrated process can be used to generate general stress patterns including but not limited to the patterns shown in FIGS. 5, 6A, 8A, 9A, 9B, and 9C. FIGS. 7A-7L are side views of the substrate and other layers of the sample described herein.

Figure 7A:
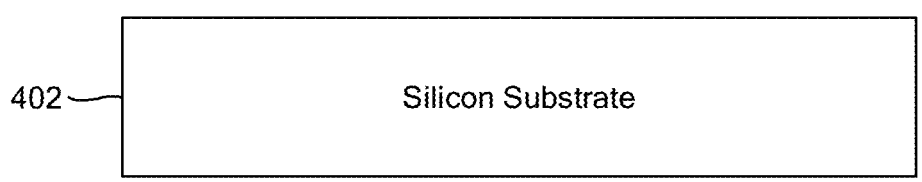
FIGS. 7A-7L are a series of side views illustrating a process for patterning a general stress field on a substrate, according to some embodiments.

Referring to FIG. 7A, a first step can include preparing a substrate for patterning a general stress field.

Figure 7B:
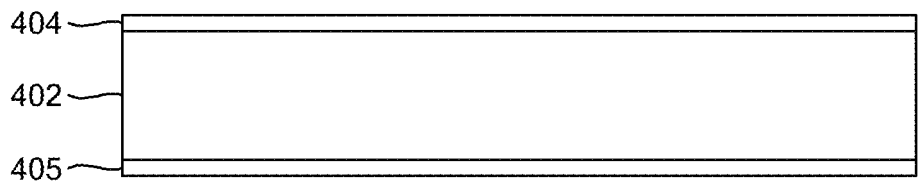

Referring to FIG. 7B, a second step can include growing a stressed layer 404 on a top side of the substrate 402, and another stressed layer 405 on a bottom side of the substrate 402. In some embodiments, stressed layers 404, 405 can be a thermal oxide that is grown at 1050° C. for 3 hours, to produce approximately 200 nm-thick oxide layers on both sides of the substrate 402.

Figure 7C:
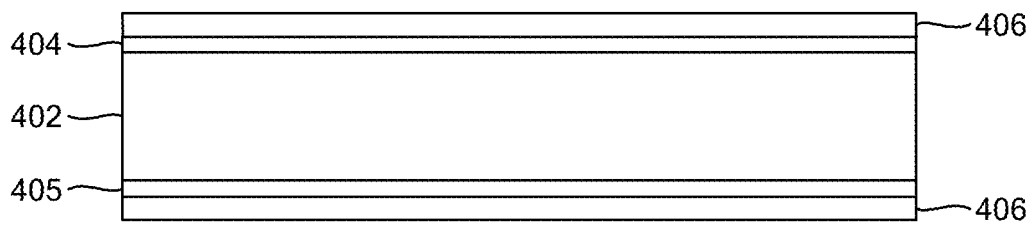

Referring to FIG. 7C, a third step can include spin coating a first layer of photoresist 406 onto the top and bottom sides of the sample (i.e., above top-side stressed layer 404 and below bottom-side stressed layer 405). In some embodiments, the first layers of photoresist 406 can be a DOW SPR-700 photoresist that is spun at 3000 RPM to produce 1.0 μm-thick photoresist layers 406. After spin coating, the sample can be baked at 90° C. for 30 minutes to harden photoresist layers 406.

Figure 7D:
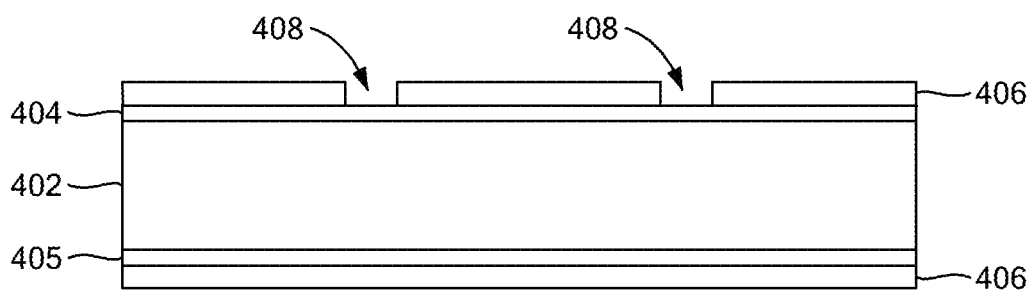

Referring to FIG. 7D, in a fourth step, the sample can be patterned to create geometrically-shaped unit cells 408. In some embodiments, the patterning 408 may correspond to the circular unit cells 310 illustrated in FIG. 5. While the patterning 408 appears as two rectangular cutouts in the side view of FIG. 7D, these can correspond to the edges of circular regions or other geometric regions that would be visible from a corresponding top view. In some instances, the sample can be patterned by a Heidelberg MLA-150 direct write lithography tool and then dipped in CD-26 developer for 90 seconds to obtain the periodic circle pattern 408 in the photoresist.

Figure 7E:
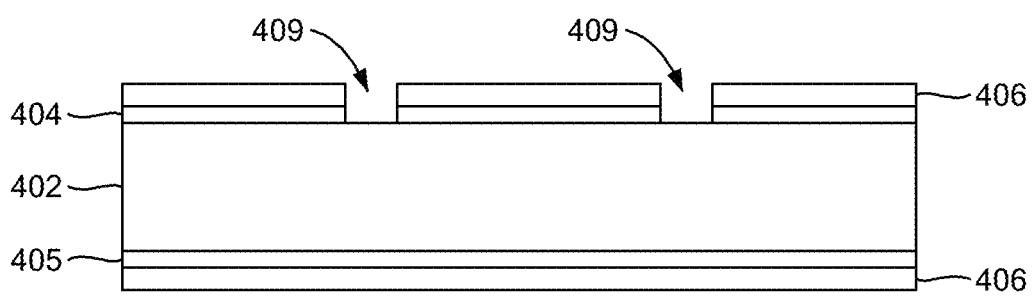

Referring to FIG. 7E, in a fifth step, the sample can be dipped in buffered oxide etch (BOE) causing the patterning 408 to be transferred into the top-side stressed layer 404, as indicated by arrows 409. In some embodiments, the sample may be dipped in BOE for approximately 5 minutes.

Figure 7F:
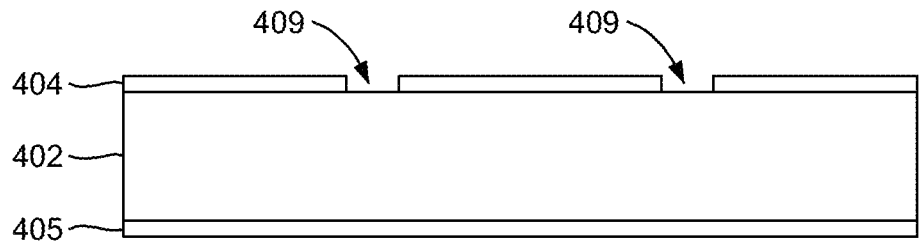

Referring to FIG. 7F, in a sixth step, the sample can be piranha cleaned to remove the photoresist 406 from the top and bottom sides of the sample.

Figure 7G:
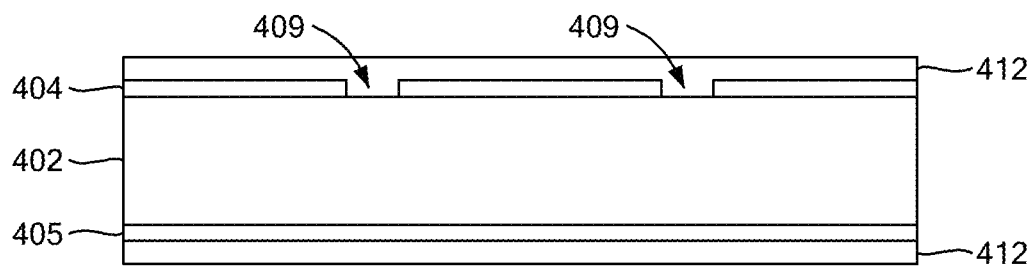

Referring to FIG. 7G, in a seventh step, the top and bottom sides of the sample can be coated with a second layer of photoresist 412. In some instances, the sample can be spin coated with SPR-700 and baked.

Figure 7H:
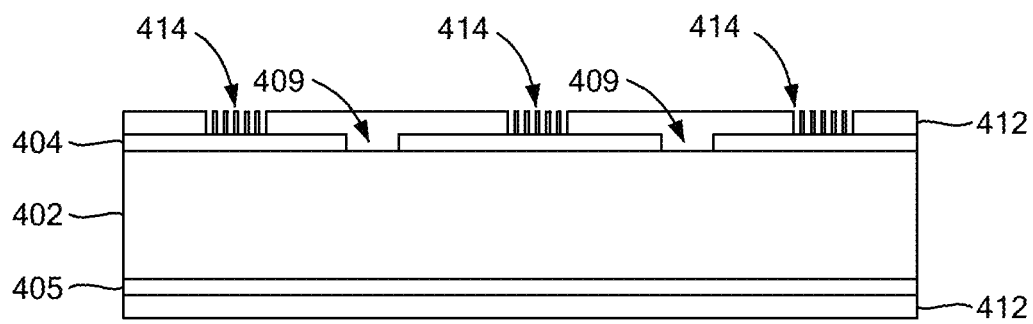

Referring to FIG. 7H, in an eighth step, grating bars 414 can be generated within the top-side second layer of photoresist 412. In some instances, this can include exposing the sample with a grating pattern and developing it in CD-26 to produce grating bars in the photoresist. In some instances, the pitch of grating bars 414 can be 10 μm. Grating bars 414 may be the same as or similar to grating bars 320 of FIG. 5. In some embodiments, the process can include generating grating bars 414 having an aspect ratio greater than or equal to 0.1 or 0.2.

Figure 7I:
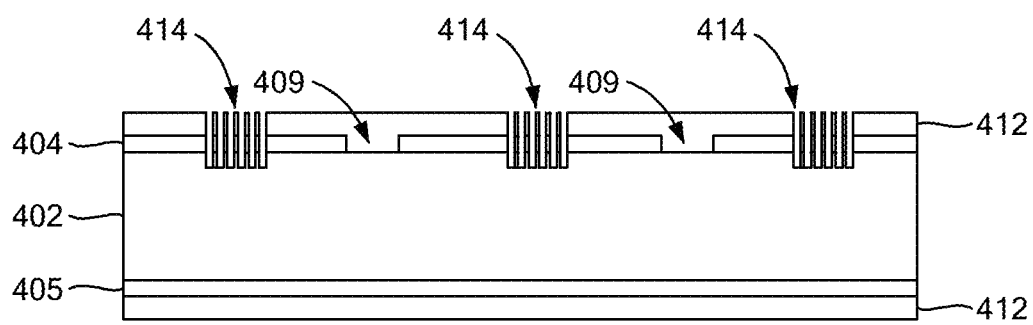

Referring to FIG. 7I, in a ninth step, the sample can be dipped in a BOE to remove thermal oxide within open areas, and then etched to extend the grating bars 414 into the silicon. In some embodiments, the etching can be carried out by a SPTS STS-2 reactive ion etch (RIE) tool. The RIE process, in some embodiments, can etch the lines approximately 10 μm deep into silicon and create a grating bar aspect ratio of approximately one (1). As previously discussed, to create uniaxial stress, it may be desirable to have the aspect ratio of the grating bars is close to one (1). The process illustrated in FIGS. 7A-7L can make it easier to realize such an aspect ratio, even where the stressed layer 120 is very thin (e.g., less than 10 μm).

Figure 7J:
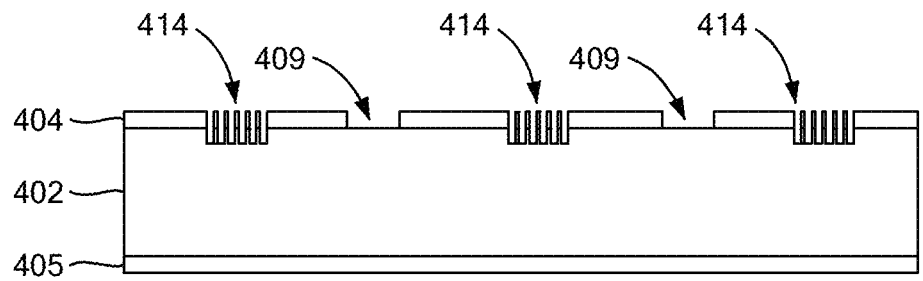

Referring to FIG. 7J, in a tenth step, the photoresist can be removed from the sample by piranha and plasma cleans. The stress in the top-side stressed layer 404 (i.e., the thermal oxide) is compressive, therefore the stressed layer 405 on the opposite side of the substrate 402 can be used to balance the stress from the top-side stressed layer 404.

Figure 7K:
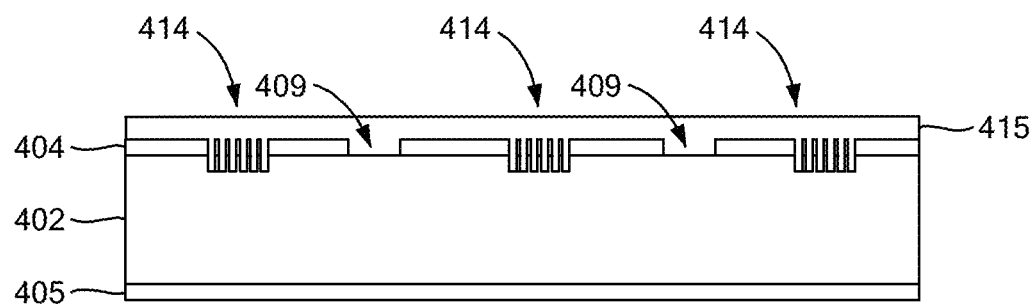
Figure 7L:
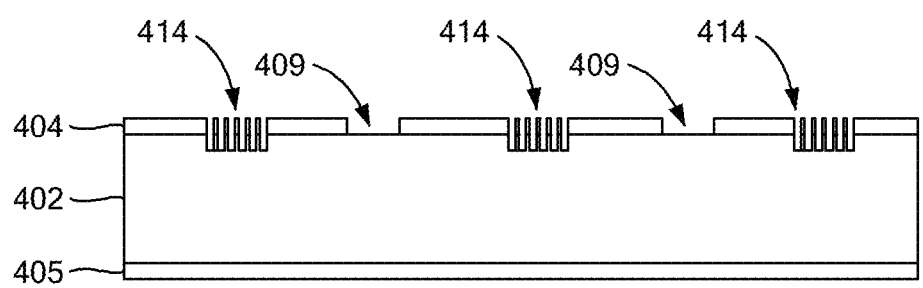

Referring to FIG. 7K, the process can include an eleventh step of coating the top side of the sample with a third layer of photoresist 415, such as SPR-700. The sample can then be dipped in diluted BOE to uniformly thin the bottom-side stressed layer 405 such that the top-side and bottom-side stresses are balanced Referring to FIG. 7L, in a twelfth step, the sample can be piranha cleaned to remove the third layer of photoresist 415.

Additional types of deformations can be created using the processes described herein. Astigmatism can be created by first calculating the general stress field for an astigmatism deformation using the following equation:

$$N_1 = S_0, N_2 = -S_0,$$

$$\phi = 0 \tag{4}$$

where $N_1$ and $N_2$ are the two principal stresses and $S_0$ is an arbitrary constant stress and c is the stress orientation angle. The device is created such that there is a stressed layer on the back of the substrate that equivalently produces a uniform tensile stress over the front surface, knowing this the general stress field can be solved with by the equations:

$$N_1 = S_{front\_1} - S_{back} = S_0$$

$$N_2 = S_{front\_2} - S_{back} = -S_0 \tag{5}$$

where $-S_{back}$ is the biased tensile stress, $S_{front\_1}$ is one principal stress which should be $2S_{back}$, and the other principal stress $S_{front\_2}$ should field be zero. Therefore, the general stress on the top of the device is a uniaxial stress with an amplitude of twice the equibiaxial stress of the back of the substrate. Using calibration map illustrated in FIG. 6B, it can be observed that the maximum uniaxial stress occurs when the AF is 100% and when the DC is 100%. This produces a uniaxial stress with an amplitude of approximately 68%. The thickness of the stressed layer on the back side of the substrate can be reduced during fabrication thereby reducing the residual stress on the back side to approximately 34%.

Figure 8A:
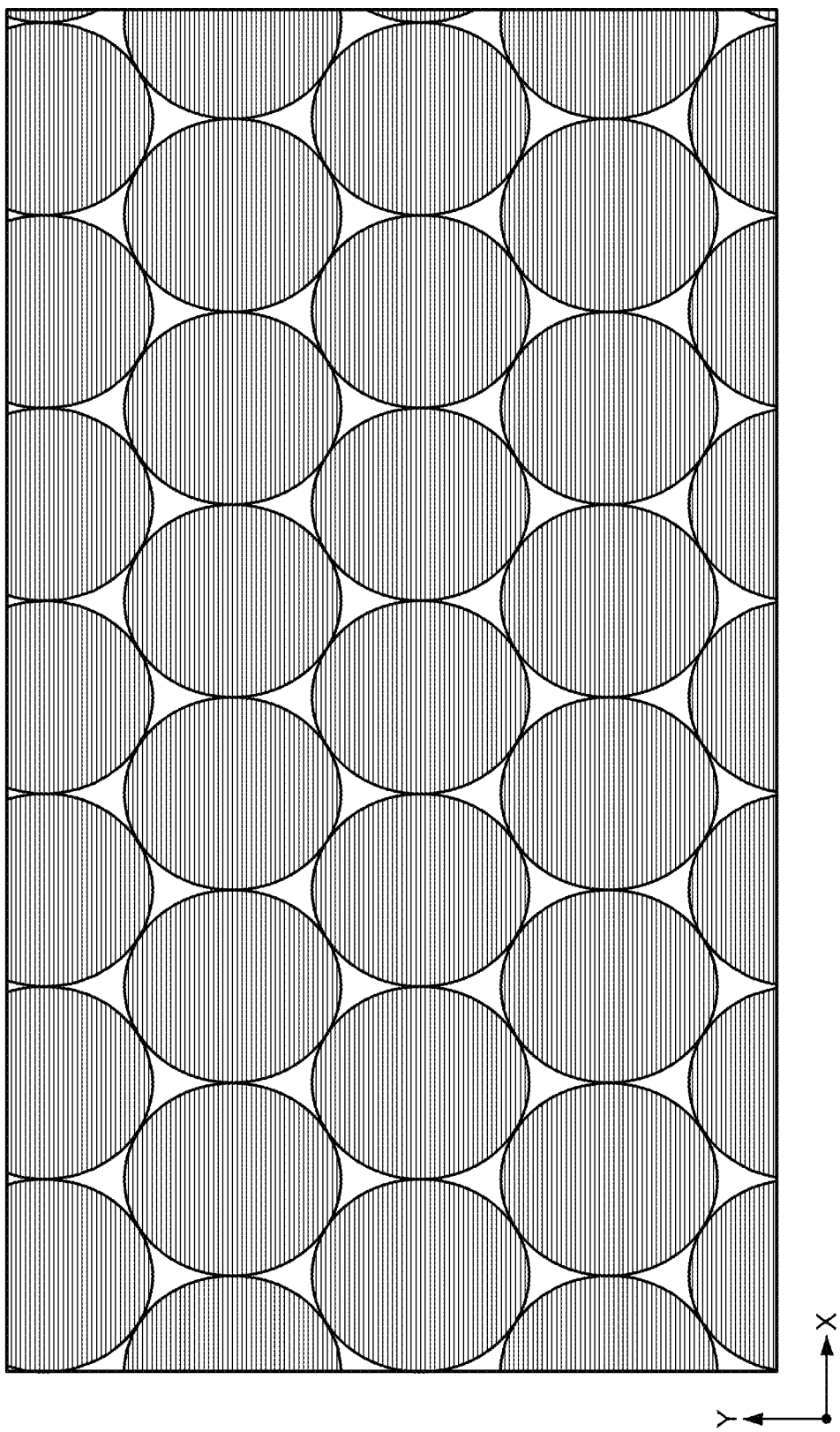
FIG. 8A illustrates an example of a portion of a general stress pattern for astigmatism.
Figure 8B:
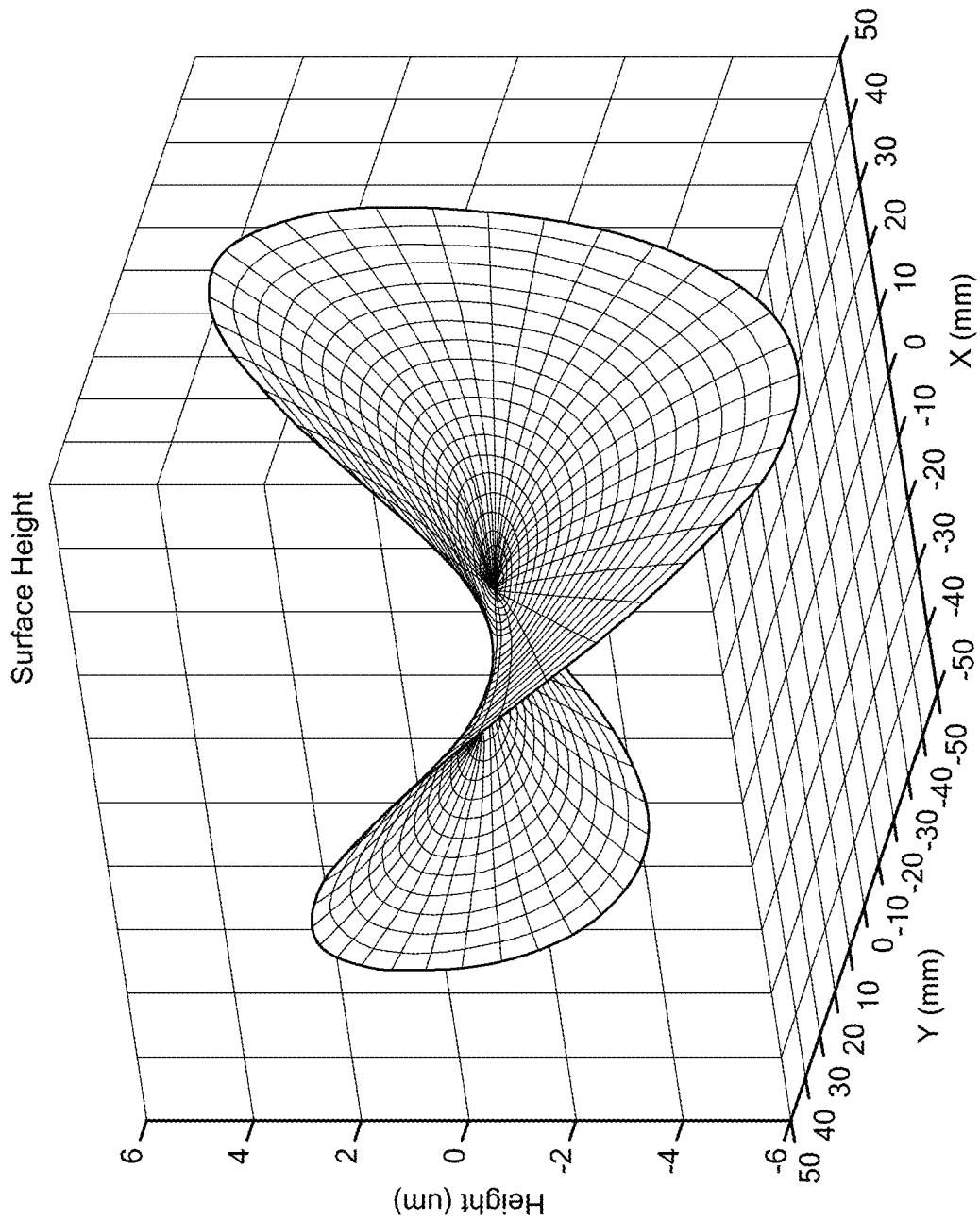
FIG. 8B is a plot showing measured deformation using the general stress pattern of FIG. 8A.

Illustrated in FIG. 8A is a stress pattern for astigmatism that can be designed using equations (4) and (5) described above and fabricated using the techniques disclosed herein. During the fabrication process, the topology of the substrate before and after patterning can be measured and the deformation can be calculated based on these measurements. Table 1 below shows a combination of Zernike terms that represent the calculated deformation. A plot of the measured deformation is illustrated in FIG. 8B.

TABLE 1

| Z20 | Z2-2 | Z22 | Z3-1 | Z31 | Z3-3 | Z33 | Z40 | Z42 | Z4-2 | Z44 | Z4-4 |
|---|---|---|---|---|---|---|---|---|---|---|---|
| 17.65 | 54.72 | 1740.33 | 12.53 | 3.5 | −10.59 | 10.27 | −3.85 | 0.35 | 0.74 | −1.12 | −2.47 |

Figure 9A:
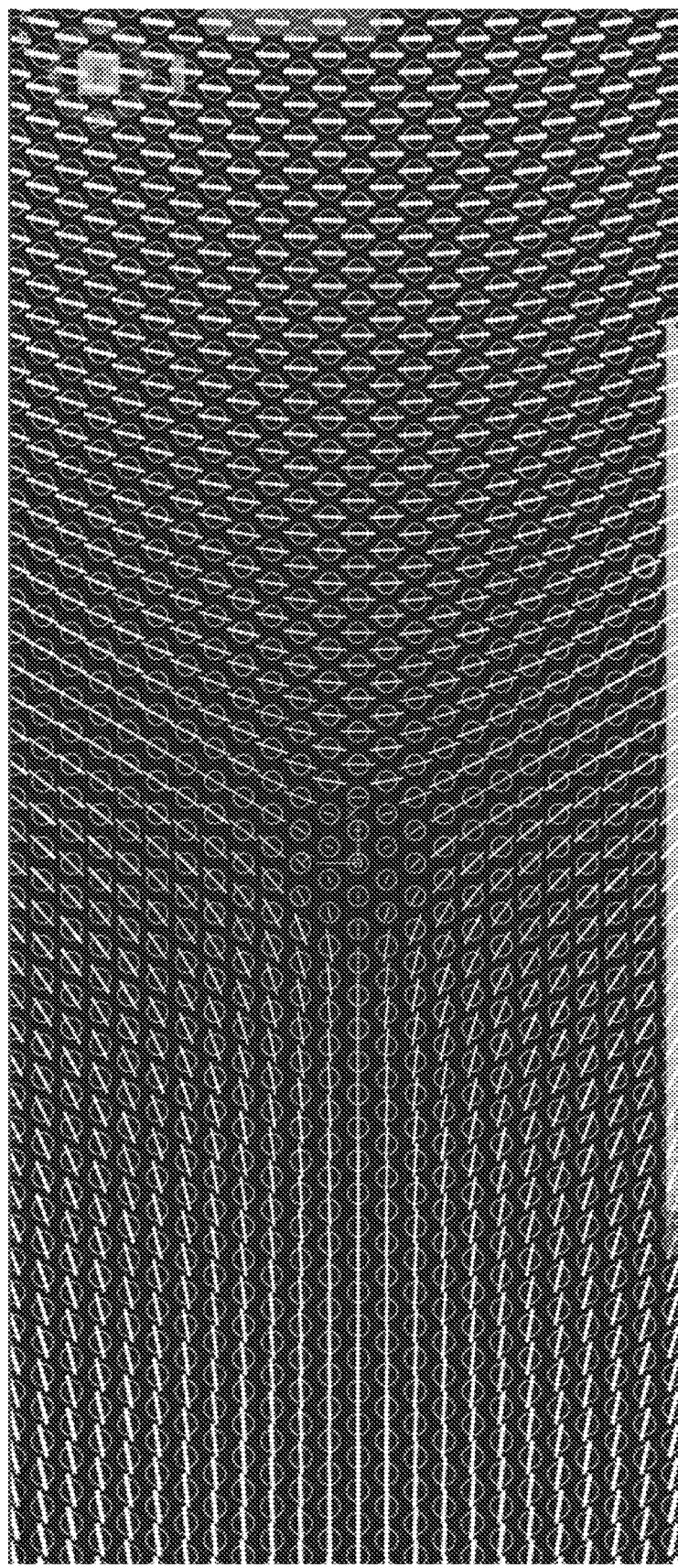
FIG. 9A is a diagram of a portion of a general stress pattern to control a trefoil deformation, according to some embodiments.
Figure 9B:
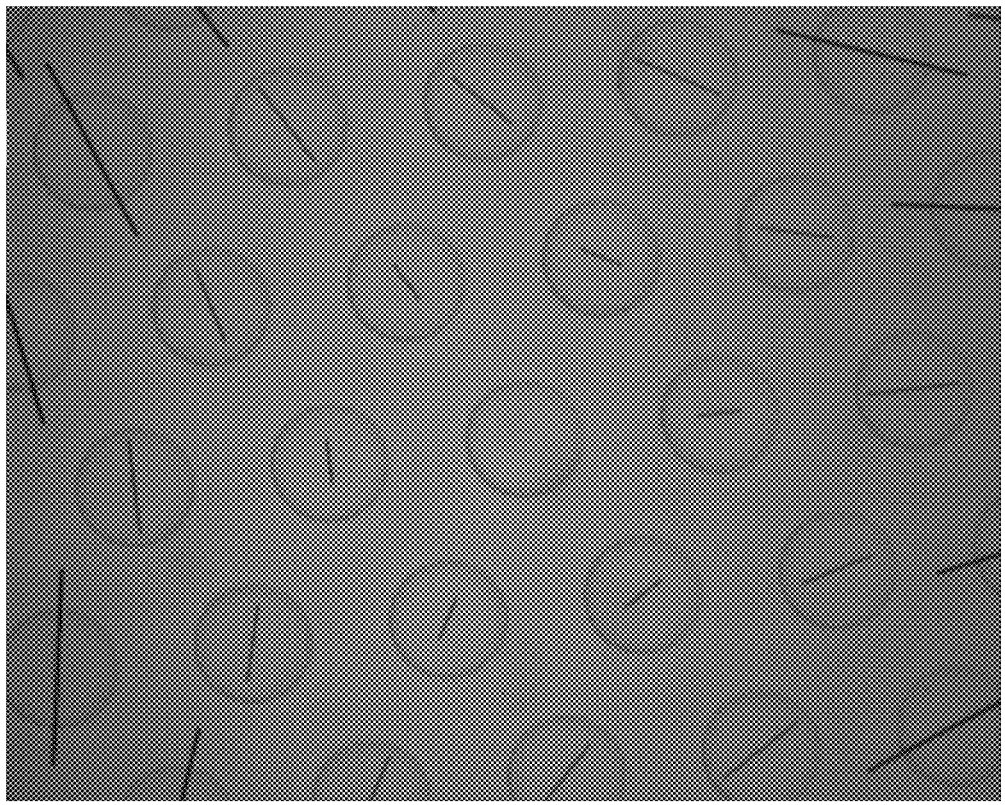
FIGS. 9B, and 9C are micrographs of a portion of a fabricated general stress pattern to control a trefoil deformation.
Figure 9C:
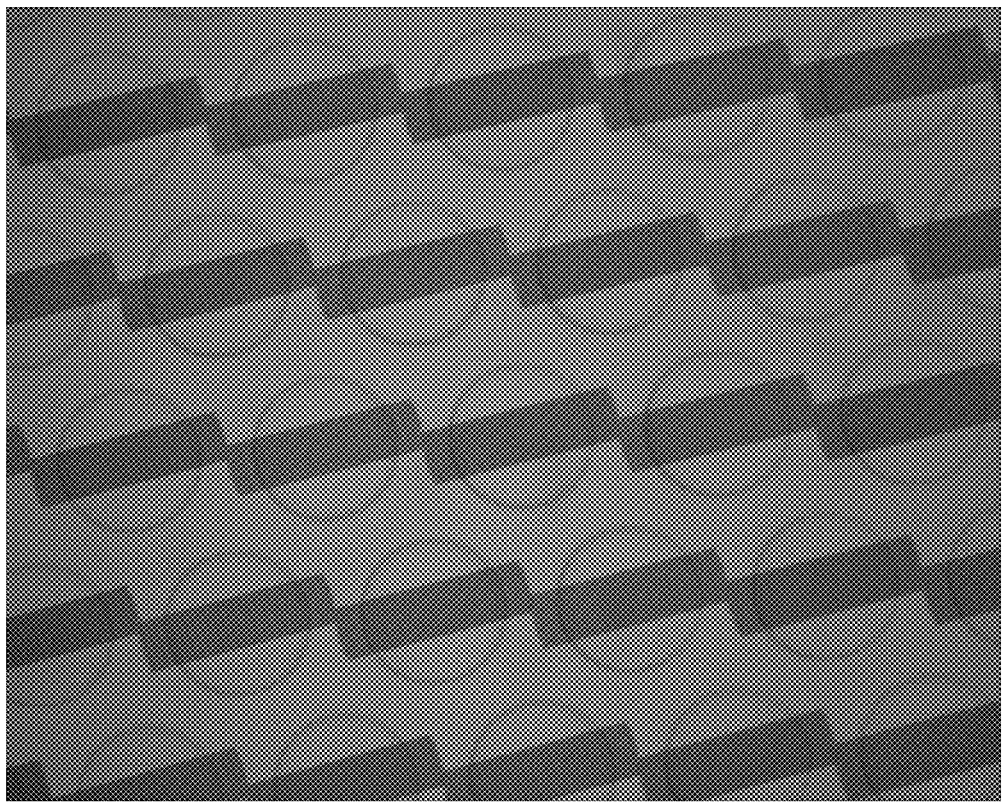
Figure 9D:
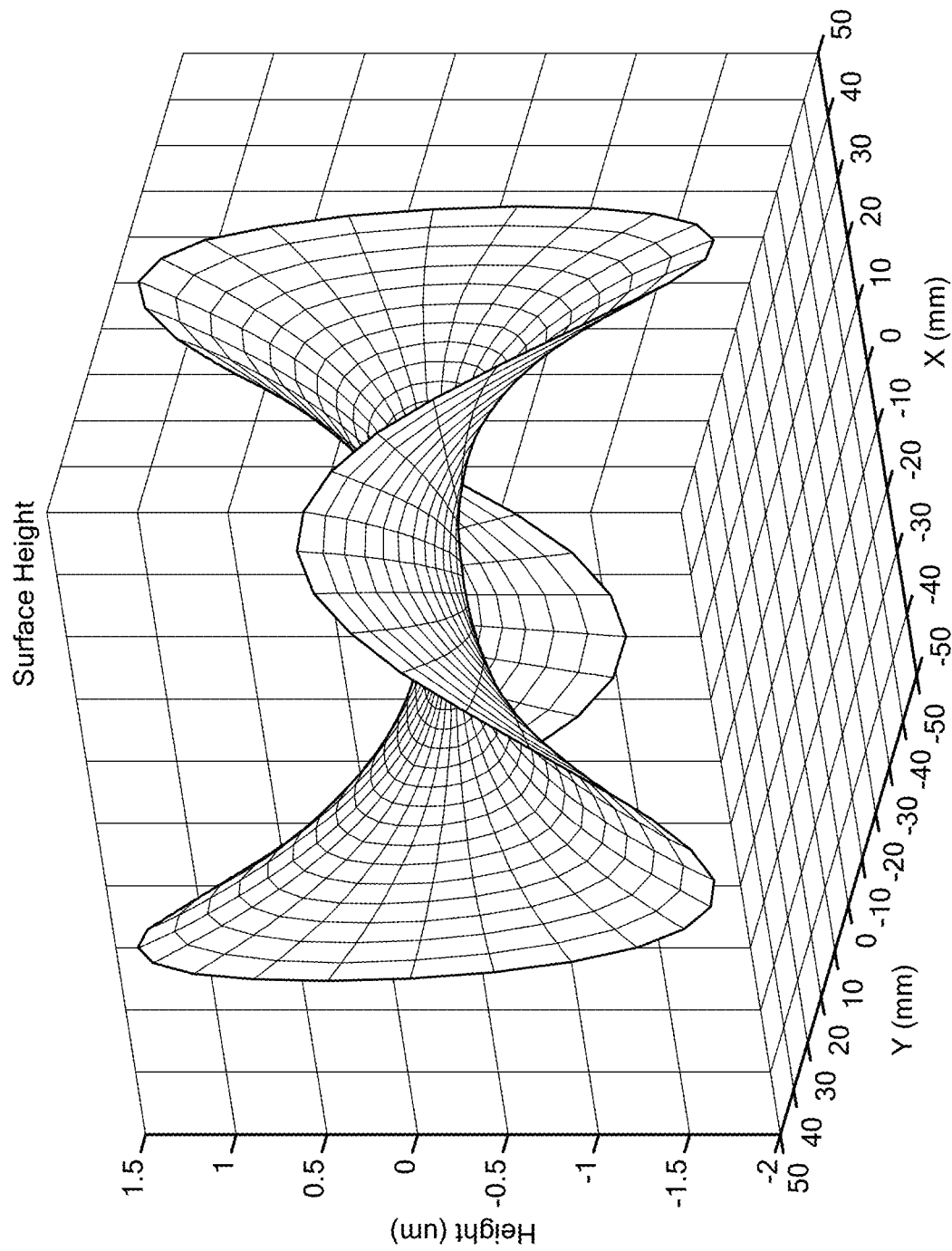
FIG. 9D is a plot showing measured deformation using the general stress pattern of FIG. 9A.

Referring to FIGS. 9A-9C, the general stress field for a tri-foil deformation is shown by the following equations:

$$N_1 = S_0 \times 2\frac{r}{R}, N_2 = -S_0 \times 2\frac{r}{R} \tag{6}$$

$$\phi = \frac{1}{2}(\pi - \theta),$$

where (r, 0) is a location on a substrate represented by polar coordinates and where r=0 is at the center of the substrate, which can be a silicon wafer. In these equations, R can be the radius of the substrate which can be 50 mm. Equations (6) demonstrate that trefoil deformation requires anti-biaxial stress, and that the amplitude of the stress at a specific location on the substrate can be proportional to the distance from the center of the substrate. The orientation of the principal stresses at this location can be proportional to the polar angle. The general stress field on the patterned side of the substrate can be calculated using:

$$N_u = S_{back} \times 2\frac{r}{R}, N_e = S_{back} \times \left(1 - \frac{r}{R}\right) \tag{7}$$

$$\phi = \frac{1}{2}(\pi - \theta),$$

where $N_u$ is the amplitude of uniaxial stress and $N_e$ is equibiaxial stress. Around the edge of the substrate where r=R, the amplitude of the uniaxial stress $N_u$ can be at its highest level and that of equibiaxial stress can be zero. In order to maximize the deformation, $N_u(r=R)$ is determined to be 68%, which is the maximum value that the pattern can create. Subsequently, $S_{back}$ is determined to be 34%. The patterns designed using these equations are illustrated in FIGS. 9A-9C. Measurements of the deformation created by the designed trefoil pattern are listed in Table 2 and plotted in FIG. 9D.

TABLE 2

| Z20 | Z2-2 | Z22 | Z3-1 | Z31 | Z3-3 | Z33 | Z40 | Z42 | Z4-2 | Z44 | Z4-4 |
|---|---|---|---|---|---|---|---|---|---|---|---|
| 16.63 | −44.05 | −8.15 | 7.6 | −18.57 | 21.44 | 479.98 | −15.25 | 19.27 | 1.1 | 8.87 | 3.26 |

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

The invention claimed is:

1. A device, comprising:
   a substrate; and
   a stressed layer disposed on a first surface of the substrate, the stressed layer comprising:
   a first set of patterns having a predetermined geometry, size, and arrangement selected to control an equibiaxial stress field of the stressed layer, wherein the equibiaxial stress field varies in magnitude over the first surface of the substrate, and
   a second set of patterns etched into the first set of patterns and the substrate, the second set of patterns comprising a plurality of substantially parallel lines arranged to control at least a uniaxial stress field of the stressed layer, wherein the uniaxial stress field varies in magnitude over the first surface of the substrate.

2. The device of claim 1 wherein the stressed layer comprises a thermal oxide.

3. The device of claim 1 wherein the stressed layer comprises a second stressed layer disposed on a second surface of the substrate opposite from the first surface.

4. The device of claim 1 wherein the magnitude and an orientation of the uniaxial stress field varies according to a position on the substrate.

5. The device of claim 1 wherein the plurality of substantially parallel lines comprise a plurality of substantially parallel grating bars, wherein ones of the plurality of grating bars have an aspect ratio selected to induce a predetermined uniaxial stress within the stressed layer, wherein the aspect ratio for a grating bar is defined as a ratio of a height of the grating bar divided by a width of the grating bar.

6. The device of claim 5 wherein the aspect ratio is greater than or equal to 0.1.

7. The device of claim 1 wherein the first set of patterns comprises one or more geometric regions.

8. The device of claim 7 wherein the one or more geometric regions have varying dimensions.

9. The device of claim 7 wherein the second set of patterns comprises a first plurality of substantially parallel lines etched into a first one of the one or more geometric regions and a second plurality of substantially parallel lines etched into a second one of the one or more geometric regions, wherein the first and second pluralities of substantially parallel lines have different orientations.

10. The device of claim 1 wherein the substrate comprises a silicon wafer.

11. A method for fabricating a device, the method comprising:
    providing a substrate having a stressed layer disposed on a first surface of the substrate;
    etching a first set of patterns into the stressed layer, the first set of patterns having a predetermined geometry, size, and arrangement selected to control an equibiaxial stress field of the stressed layer, wherein the equibiaxial stress field varies in magnitude over the first surface of the substrate; and
    etching a second set of patterns into the first set of patterns and the substrate, the second set of patterns comprising a plurality of substantially parallel lines arranged to control at least a uniaxial stress field of the stressed layer, wherein the uniaxial stress field varies in magnitude over the first surface of the substrate.

12. The method of claim 11 wherein etching the second set of patterns comprises:
    using a first method to etch the second set of patterns into the stressed layer; and
    using a second method to etch the second set of patterns into the substrate.

13. The method of claim 12 wherein using the first method comprises using wet etching.

14. The method of claim 12 wherein using the second method comprises using one of reactive ion etching or laser cutting.

15. The method of claim 12 wherein using the first method comprises using laser cutting.

16. The method of claim 11 wherein etching the second set of patterns comprises etching the second set of patterns into the substrate to a depth dictated by a predetermined aspect ratio.

* * * * *